US012744070B2

(12) United States Patent
Kitagawa

(10) Patent No.: US 12,744,070 B2
(45) Date of Patent: Sep. 22, 2026

(54) PLATE LINE DRIVERS WITH A SHARED BIAS DEVICE

(71) Applicant: Micron Technology, Inc., Boise, ID (US)

(72) Inventor: Makoto Kitagawa, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 215 days.

(21) Appl. No.: 18/518,090

(22) Filed: Nov. 22, 2023

(65) Prior Publication Data

US 2024/0212734 A1 Jun. 27, 2024

Related U.S. Application Data

(60) Provisional application No. 63/435,492, filed on Dec. 27, 2022.

(51) Int. Cl.
*G11C 11/22* (2006.01)

(52) U.S. Cl.
CPC ........ *G11C 11/2255* (2013.01); *G11C 11/221* (2013.01)

(58) Field of Classification Search
CPC .... G11C 11/2255; G11C 11/221; G11C 11/22
See application file for complete search history.

(56) References Cited

U.S. PATENT DOCUMENTS

| | | | | |
|---|---|---|---|---|
| 5,880,989 | A * | 3/1999 | Wilson | G11C 11/22 365/145 |
| 10,510,423 | B2 | 12/2019 | Vimercati et al. | |
| 2001/0030894 | A1* | 10/2001 | Braun | G11C 11/22 365/200 |
| 2002/0122328 | A1* | 9/2002 | Oowaki | G11C 11/22 365/145 |
| 2010/0182820 | A1* | 7/2010 | Kitagawa | G11C 11/56 365/189.011 |
| 2019/0043595 | A1 | 2/2019 | Vimercati et al. | |

* cited by examiner

*Primary Examiner* — Han Yang
(74) *Attorney, Agent, or Firm* — Schwegman Lundberg & Woessner, P.A.

(57) ABSTRACT

A variety of applications can include apparatus having a memory device comprising plate select lines coupled to capacitors of memory cells of the memory device, plate line drivers coupled to the plate select lines, and a bias device coupled to each plate line driver. Use of a single bias device can allow for generation of robust current across multiple plate line drivers. The plate line drivers can be arranged with different formats that can operate with a single bias device. Plate select lines and the plate line driver can be structured in a scheme to balance the number of plate select lines and device counts for the plate line drivers.

20 Claims, 16 Drawing Sheets

300

| H | H | L | L | ACTIVATED PLATE | |
|---|---|---|---|---|---|
| SELH_L2<0> | SELH_L1<0> | SELL_L2<0> | SELL_L1<0> | 0 | FIRST GROUP |
| SELH_L2<0> | SELH_L1<1> | SELL_L2<0> | SELL_L1<1> | 1 | |
| SELH_L2<0> | SELH_L1<2> | SELL_L2<0> | SELL_L1<2> | 2 | |
| SELH_L2<0> | SELH_L1<3> | SELL_L2<0> | SELL_L1<3> | 3 | |
| SELH_L2<1> | SELH_L1<0> | SELL_L2<1> | SELL_L1<0> | 4 | SECOND GROUP |
| SELH_L2<1> | SELH_L1<1> | SELL_L2<1> | SELL_L1<1> | 5 | |
| SELH_L2<1> | SELH_L1<2> | SELL_L2<1> | SELL_L1<2> | 6 | |
| SELH_L2<1> | SELH_L1<3> | SELL_L2<1> | SELL_L1<3> | 7 | |
| SELH_L2<2> | SELH_L1<0> | SELL_L2<2> | SELL_L1<0> | 8 | THIRD GROUP |
| SELH_L2<2> | SELH_L1<1> | SELL_L2<2> | SELL_L1<1> | 9 | |
| SELH_L2<2> | SELH_L1<2> | SELL_L2<2> | SELL_L1<2> | 10 | |
| SELH_L2<2> | SELH_L1<3> | SELL_L2<2> | SELL_L1<3> | 11 | |
| SELH_L2<3> | SELH_L1<0> | SELL_L2<3> | SELL_L1<0> | 12 | FOURTH GROUP |
| SELH_L2<3> | SELH_L1<1> | SELL_L2<3> | SELL_L1<1> | 13 | |
| SELH_L2<3> | SELH_L1<2> | SELL_L2<3> | SELL_L1<2> | 14 | |
| SELH_L2<3> | SELH_L1<3> | SELL_L2<3> | SELL_L1<3> | 15 | |

FIG. 3

PLATE LINE DRIVERS WITH A SHARED BIAS DEVICE

PRIORITY APPLICATION

This application claims the benefit of priority to U.S. Provisional Application Ser. No. 63/435,492, filed 27 Dec. 2022, which is incorporated herein by reference in its entirety.

FIELD OF THE DISCLOSURE

Embodiments of the disclosure relate generally to electronic devices and, more specifically, to arrangements of plate line drivers for memory arrays of memory devices.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. Properties of memory devices and other electronic devices can be improved by enhancements to the selection of storage units in the memory devices.

BRIEF DESCRIPTION OF THE DRAWINGS

The drawings, which are not necessarily drawn to scale, illustrate generally, by way of example, but not by way of limitation, various embodiments discussed in the present document.

FIG. 3 shows a table illustrating signals on plate select lines of the arrangement of FIGS. 2A-2B to activate plates of subarrays of a memory device, according to various embodiments.

DETAILED DESCRIPTION

Figure 1:
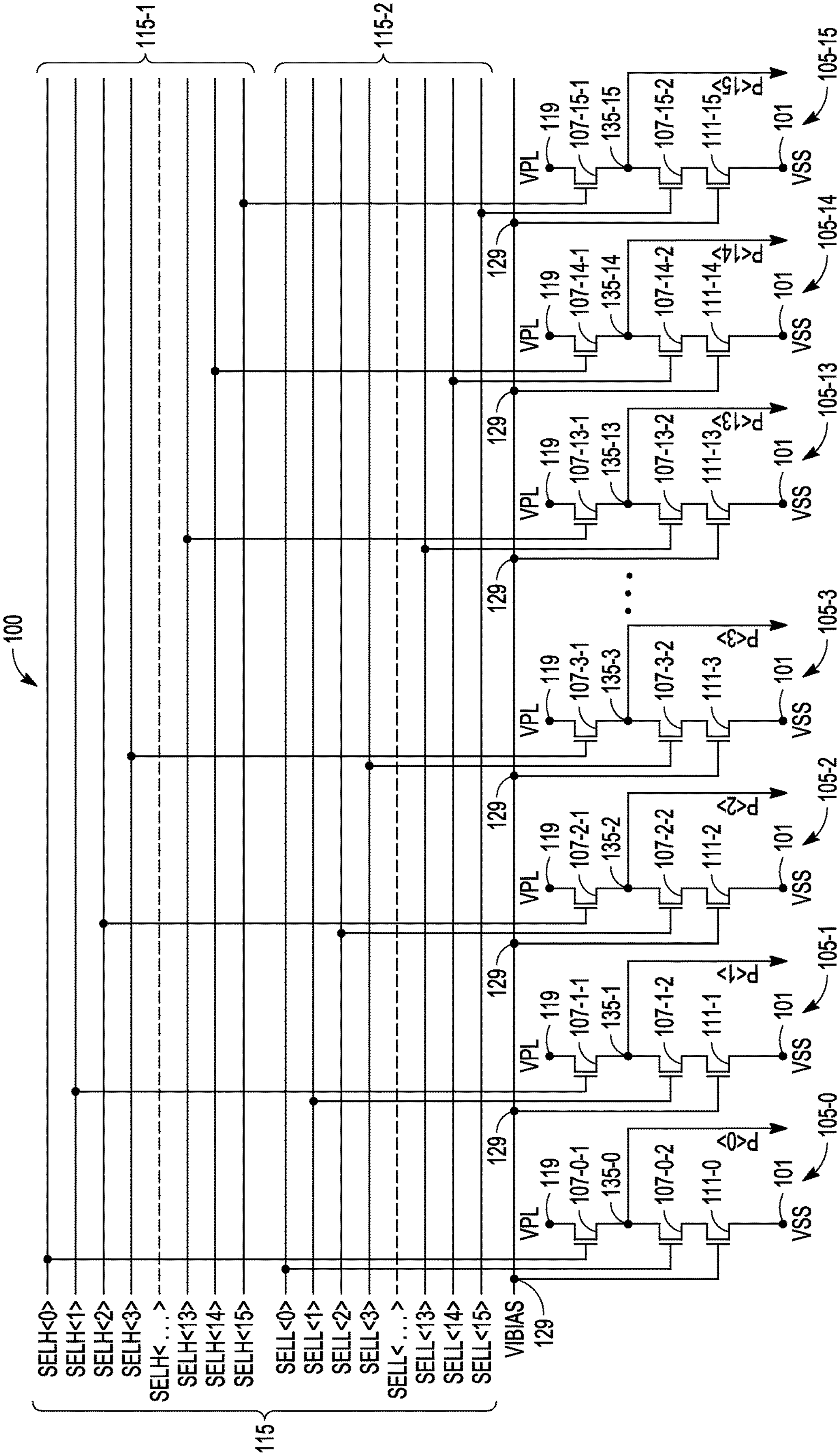
FIG. 1 illustrates a conventional approach to an arrangement of plate select lines and plate line drivers for subarrays of a memory array of a memory device, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments can be utilized, and structural, logical, mechanical, and electrical changes can be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

In memory devices having memory cells that use capacitors as storage elements, a memory cell can include a capacitor as a storage element with the capacitor having a plate coupled to a transistor and another plate coupled to a reference line, referred to herein as a plate line (PL). The transistor of the memory cell can be a switching unit to the capacitor, with the transistor coupled to an access line (WL), for example a word line, and coupled to a data line (DL), for example a bit line. DL can also be referred to as a digit line. The PL can couple the respective plate to a reference, such as system supply voltage (VSS), or to a plate line voltage (VPL) for a memory cell sense operation. In a ferroelectric RAM (FeRAM), a ferroelectric capacitor in each memory can be used as a storage device. A FeRAM, as a non-volatile memory, can maintain a stored logic state for extended periods of time even in the absence of an external power source. DRAMs can lose their stored state over time unless the DRAMS are periodically refreshed by an external power source.

A FeRAM can use similar device architectures as volatile memory but have non-volatile properties due to the use of a ferroelectric capacitor as a storage device. A ferroelectric memory cell can include a capacitor with a ferroelectric as the insulating material, where the ferroelectric has non-linear polarization properties, which are characterized by a spontaneous electric polarization that includes a voltage hysteresis. A ferroelectric maintains a non-zero electric polarization in the absence of an electric field such that different levels of charge of a ferroelectric capacitor can represent different logic states. A ferroelectric memory cell can be written by applying a voltage across the ferroelectric capacitor. Due to the ferroelectric between the plates of the capacitor of the ferroelectric memory cell, activation of the ferroelectric memory cell can be made in a two sequence operation of sensing and precharge. Biasing the PL can result in a voltage difference across capacitor, which voltage difference is the difference between the voltage on the plate, coupled to the PL, and the voltage on DL. In the sensing operation, the voltage on the PL can be raised followed by raising the voltage on the access line to the selected ferroelectric memory cell, where the voltage can be lowered back during the sensing operation while maintaining the voltage of the access line. During the precharge, with the PL maintained in the base line state and the access line maintained in the selected state, the voltage on the data line can be set to the logic state. The voltage on the DL can be lowered prior to removal of the select voltage on the access line.

The memory cells can be arranged in a memory array arranged as subarrays, where the plates of capacitors in each subarray are coupled to the PL assigned to the subarray, effectively defining a plate for the subarray. Whenever voltage of the PL to a memory cell moves, such as to a higher level from a lower level or to the lower level from the higher level, the voltage of the DL corresponding to the PL should follow the movement of the voltage on the PL to avoid a disturb voltage across memory cells on a selected WL and unselected DL. A disturb voltage to a memory cell is a voltage to which the memory cell is exposed, when nearby memory cells are accessed, that can affect charge stored in the memory cell. However, due to a resistance-capacitance product (RC) of PL being different from a RC of the DL, the DL follows the PL movement with a delay. In conventional approaches, to mitigate the delay between the voltages on the PL and the DL, procedures to control the slew rate of the PL are implemented.

To reduce power of the voltage moving on the PL, an architecture can be implemented with the memory array of the memory device organized as multiple subarrays with WLs, from an access driver, coupled to memory cells of the multiple subarrays and with the memory cells coupled to sense amplifiers selectively by DLs. Each subarray can be assigned to PL driver that provides a PL to the plate of the capacitor of each memory cell in the subarray. To selectively activate a PL, a number of plate select lines are coupled to the PL drivers to select which divers are selected to provide an active PL signal, based on signals applied to the plate select lines. As such memory devices are designed with increased capacity, the number of the subarrays and PL drivers can increase leading to a large number of plate select lines, which can result in undesired amount of routing relative to device counts of PL drivers.

FIG. 1 illustrates a conventional approach to an arrangement 100 of plate select lines and PL drivers for subarrays of a memory array of a memory device. Each PL driver has two transistors physically in series with a bias transistor, where one of the two transistors is coupled to a plate select line different from a plate select line to which the other one of the two transistors is coupled. Signals on the two plate lines can effectively be complementary to select a plate line and effectively reversed to unselect the plate line. For example, the two signals can be a high voltage signal and a low voltage signal, where a voltage signal is high relative to turning on a transistor and a voltage signal is low relative to turning off a transistor.

In the example of FIG. 1, arrangement 100 includes a set 115 of thirty-two of plate select lines arranged as subsets 115-1 and 115-2 with each subset 115-1 and 115-2 having sixteen plate select lines and sixteen PL drivers 105-0,

105-1, 105-2, 105-3 . . . 105-13, 105-14, and 105-15 (105-N, N=0, 1 . . . 15) coupled to specific ones of the plate select lines. Subset 115-1 can form a high side group of plate select lines, which can also be referenced as a positive side of plate select lines. Subset 115-2 can form a low side group of plate select lines, which can also be referenced as a negative side of plate select lines. The sixteen plate select lines of subset 115-1 can be arranged, for coupling to PL drivers to carry signals, as select high lines SELH<N>, where N=0, 1, 2, 3 . . . 13, 14, and 15, such that a high voltage signal is applied in selecting a given PL driver. The sixteen plate select lines of subset 115-2 can be arranged, for coupling to PL drivers to carry signals, as select low lines SELL<N>, where N=0, 1, 2, 3 . . . 13, 14, and 15, such that a low voltage signal is applied in selecting the same given PL driver. When a PL driver 105-N provides an output signal on output node 135-N coupled to PL<N>, where N=0, 1, 2, 3 . . . 13, 14, or 15, that is an unselected signal, a low voltage signal is applied to SELH<N> for the respective PL driver 105-N and a high voltage signal is applied to SELL<N> for the respective PL driver 105-N, resulting in PL<N> being maintained at a low voltage level of VSS.

Arrangement 100 includes PL drivers 105-0, 105-1, 105-2, 105-3 . . . 105-13, 105-14, and 105-15 (105-N, N=0, 1 . . . 15) coupled to set 115 of plate select lines and coupled to PL<0>, PL<1>, PL<2>, PL<3> . . . PL<13>, PL<14>, and PL<15>, respectively, that couples to sixteen subarrays (the subarrays are not shown). Each PL driver 105-N has output node 135-N coupled to a plate line PL<N> directed to a subarray of the memory array of the memory device. Each driver 105-N includes a transistor 107-N-1, a transistor 107-N-2, and a bias transistor 111-N arranged physically in series, with transistor 107-N-1 coupled to a VPL node 119 providing a voltage VPL and includes bias transistor 111-N coupled to a VSS node 101 that is configured to receive VSS. The gate of transistor 107-N-1 is coupled to SELH<N> and the gate of transistor 107-N-2 is coupled to SELL<N>. When a high voltage signal is applied to SELH<N> and a low voltage signal is applied to SELL<N> with the gate of bias transistor 111-N coupled to a bias node 129 to receive a bias voltage VIBIAS, PL<N> has a voltage of VPL from VPL node 119, which is a select state. In this situation, transistor 107-N-1 is in a conduction state coupling VPL node 119 to output node 135-N, and transistor 107-N-2 is in a non-conduction state decoupling output node 135-N from bias transistor 111-N coupled to VSS node 101. When a low voltage signal is applied to SELH<N> and a high voltage signal is applied to SELL<N> with the gate of bias transistor 111-N coupled to receive VIBIAS, PL<N> has a voltage of VSS, which is an unselected state. In this situation, transistor 107-N-1 is in a non-conduction state decoupling VPL node 119 from output node 135-N, and transistor 107-N-2 is in a conduction state coupling output node 135-N to bias transistor 111-N that is coupled to VSS node 101.

Bias transistor 111-N is coupled to bias node 129 to receive VIBIAS to provide slew rate control. Bias transistor 111-N provides current control and is structured to be large to provide sufficient current for the devices of PL driver 105-N. Bias transistor 111-N is large, with respect to length and width, relative to transistors 107-N-1 and 107-N-2. With a large number of bias transistors, there can be a mismatch of properties of the transistors of the PL drivers. Transistors 107-N-1, 107-N-2, and 111-N can be n-channel transistors.

Figure 2A:
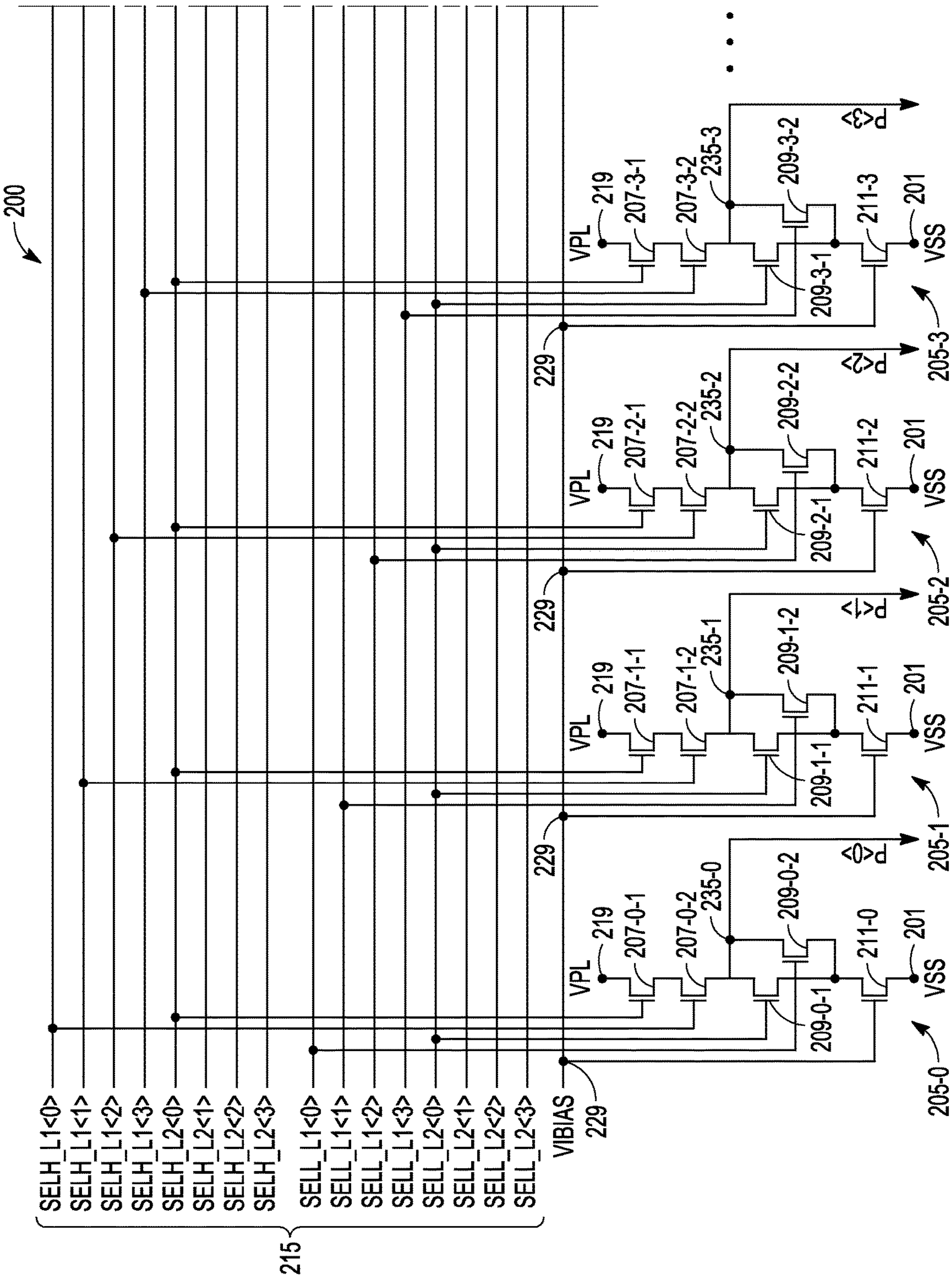
FIGS. 2A-2B illustrate an example arrangement of plate select lines and plate line drivers for subarrays of a memory array of a memory device, according to various embodiments.
Figure 2B:
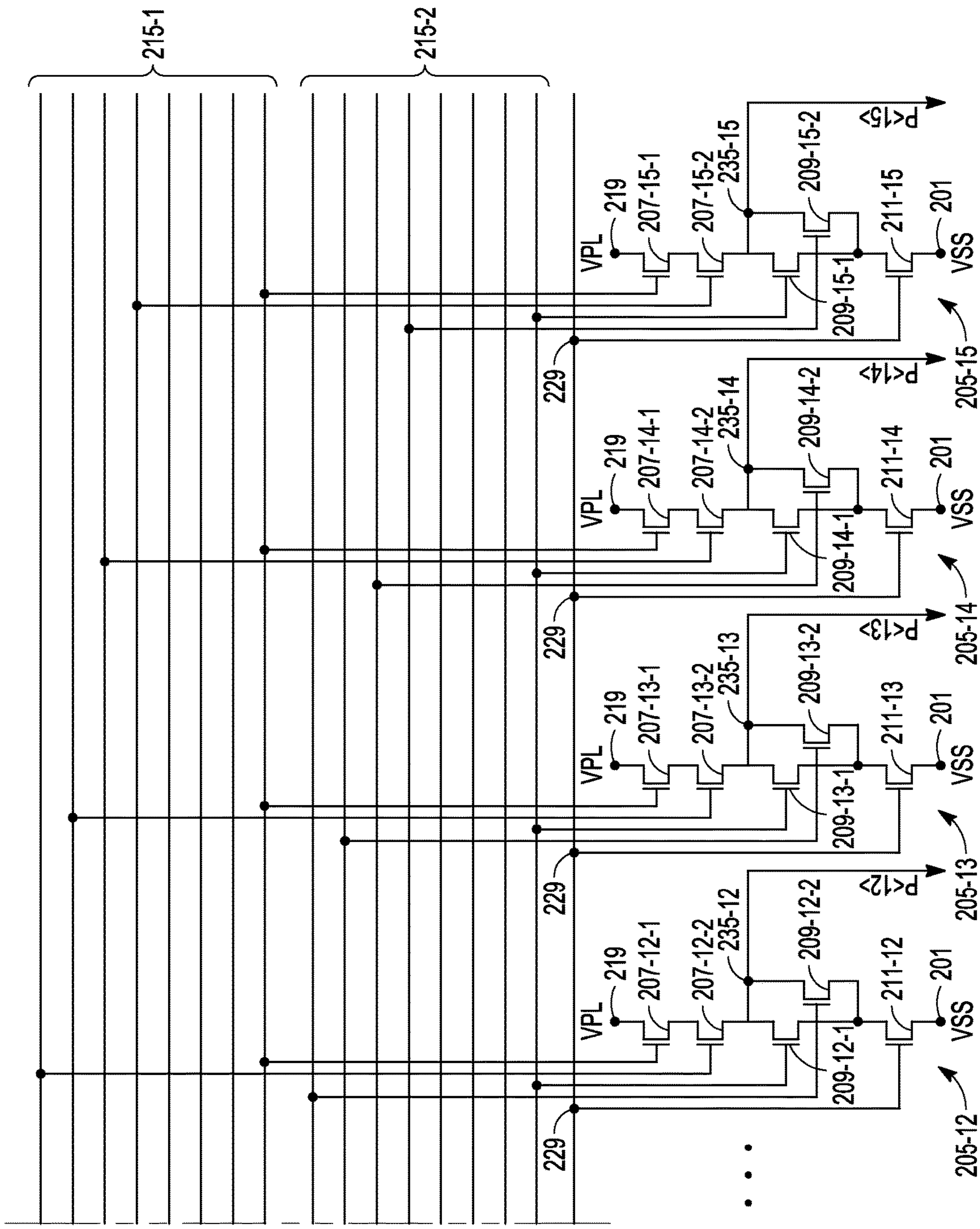

FIGS. 2A-2B illustrate an embodiment of an example arrangement 200 of plate select lines and PL drivers for subarrays of a memory array of a memory device. Arrangement 200 provides multilevel decoding that reduces the routing of the plate select lines relative to a conventional approach. For example, for an arrangement of sixteen PL drivers, arrangement 200 can reduce the number of routing plate select lines by half compared to conventional arrangement 100 of routing plate select lines of FIG. 1.

In the example of FIGS. 2A-2B, arrangement 200 includes a set 215 of sixteen plate select lines arranged as subsets 215-1 and 215-2 with each subset 215-1, 215-2 having eight plate select lines. Subset 215-1 can form a high side group of plate select lines, which can also be referenced as a positive side of plate select lines, where subset 215-1 can be arranged into two additional subsets. The two additional subsets of subset 215-1 can be arranged, for coupling to PL drivers to carry signals, as select high lines SELH_L1<N>, where N=0, 1, 2, 3, and select high lines SELH_L2<N>, where N=0, 1, 2, 3. Subset 215-2 can form a low side group of plate select lines, which can also be referenced as a negative side of plate select lines, where subset 215-2 can be arranged into two additional subsets. The two additional subsets of subset 215-2 can be arranged, for coupling to PL drivers to carry signals, as select low lines SELL_L1<N>, where N=0, 1, 2, 3, and select high lines SELL_L2<N>, where N=0, 1, 2, 3.

Arrangement 200 includes PL drivers 205-0, 205-1, 205-2, 205-3 . . . 205-12, 205-13, 205-14, and 205-15 (205-N, N=0, 1 . . . 15) coupled to set 215 of plate select lines and coupled to PL<0>, PL<1>, PL<2>, PL<3> . . . PL<12>, PL<13>, PL<14>, and PL<15>, respectively, that couples to sixteen subarrays (the subarrays are not shown). Each PL driver 205-N has an output node 235-N coupled to a plate line PL<N> directed to a subarray of the memory array of the memory device. Each driver 205-N includes a transistor 207-N-1, a transistor 207-N-2, a transistor 209-N-1, a transistor 209-N-2, and a bias transistor 211-N. Transistor 207-N-1 and transistor 207-N-2 can be structured in a series arrangement with each other, and transistor 209-N-1 and transistor 209-N-2 can be structured in a parallel arrangement with each other. Two transistors are in series when a source or drain of one of the two transistors is coupled to a source or drain of the other of the two transistors such that the same current can flow through the sources and drains of the two transistors. Two transistors are in parallel when a source/drain of a first one of the two transistors is coupled to a source/drain of the second one of the two transistors and another source/drain of the first one of the two transistors is coupled to another source/drain of the second one of the two transistors such that the same voltage occurs across the two transistors. The parallel arrangement of transistor 209-N-1 and transistor 209-N-2 can be in a series arrangement with transistor 207-N-1 and transistor 207-N-2, such that the parallel arrangement of transistor 209-N-1 and transistor 209-N-2 provides a NOR gate to the series arrangement of transistor 207-N-1 and transistor 207-N-2. The series arrangement of transistor 207-N-1, transistor 207-N-2, and the parallel arrangement of transistor 209-N-1 and transistor 209-N-2 can be situated between a VPL node 219 and bias transistor 211-N. VPL node 219 can be structured to receive a voltage VPL and bias transistor 211-N can be coupled to VSS at VSS node 201. The use of the parallel arrangement of transistor 209-N-1 and transistor 209-N-2 allows output node 235-N coupled to the series arrangement of transistor 207-N-1 and transistor 207-N-2 to switch between VPL and VSS with a reduction of plate select lines relative to arrangement 100 of FIG. 1. The transistors of the PL drivers 205-N, N=0, 1 . . . 15 for pull-up and pull-down can be n-channel transistors.

The gates of transistor 207-N-1, transistor 207-N-2, transistor 209-N-1, and transistor 209-N-2 can be coupled to specific plate select lines to a decode an instruction for accessing a memory cell coupled to a PL<N>, with bias transistors 211-0 . . . 211-N coupled to bias node 229 to receive bias voltage VIBIAS. In this example, the gates of transistor 207-N-1 and transistor 207-N-2 can be coupled to subset 215-1 of plate select lines, and the gates of transistor 209-N-1 and transistor 209-N-2 can be coupled to subset 215-2 of plate select lines. PL drivers 205-0, 205-1 . . . 205-15 can be arranged into four groups. The gates of transistor 207-N-1 of a group can be coupled to the same one of SELH_L2<N>, where N=0, 1, 2, 3. The gates of the transistors 207-N-2 of the same group can be coupled to different plate select lines of SELH_L1<N>, where N=0, 1, 2, 3. The gates of transistors 209-N-1 of the same group can be coupled to the same one of SELL_L2<N>, where N=0, 1, 2, 3. The gates of the transistors 209-N-2 of the same group can be coupled to different plate select lines of SELL_L1<N>, where N=0, 1, 2, 3. For example, a first group of PL drivers can include PL drivers 205-0, 205-1, 205-2, and 205-3. In the first group, gates of transistors 207-N-1, for each N=0, 1, 2, and 3, can be coupled to SELH_L2<0> with gate of transistor 207-0-2 coupled to SELH_L1<0>, gate of transistor 207-1-2 coupled to SELH_L1<1>, gate of transistor 207-2-2 coupled to SELH_L1<2>, and gate of transistor 207-3-2 coupled to SELH_L1<3>. For this first group of PL drivers, gates of transistors 209-N-1, for each N=0, 1, 2, and 3, can be coupled to SELL_L2<0> with gate of transistor 209-0-2 coupled to SELL_L1<0>, gate of transistor 207-1-2 coupled to SELL_L1<1>, gate of transistor 207-2-2 coupled to SELL_L1<2>, and gate of transistor 207-3-2 coupled to SELL_L1<3>.

Each of the second group, the third group, and the fourth group can be coupled to subset 215-1 and subset 215-2 of plate select lines in a manner similar to the first group of PL drivers with the coupling to the same plate select lines changing from group to group. Consider the fourth group of PL drivers that includes PL drivers 205-12, 205-13, 205-14, and 205-15. The gate of transistor 207-12-2 can be coupled to SELH_L1<0>, the gate of transistor 207-13-2 can be coupled to SELH_L1<1>, the gate of transistor 207-14-2 can be coupled to SELH_L1<2>, and gate of transistor 207-15-2 can be coupled to SELH_L1<3>, in the same manner as transistors 207-N-2, N=0, 1, 2, and 3. The gates of transistors 207-N-1, for each N=12, 13, 14, and 15, can each be coupled to the same plate select line, similar to transistors 207-N-1, for each N=0, 1, 2, and 3, but to a different one of SELH_L2<N>, N=0, 1, 2, and 3, specifically to SELH_L2<3>. For this fourth group of PL drivers, the gate of transistor 209-12-2 can be coupled to SELL_L1<0>, the gate of transistor 209-13-2 can be coupled to SELL_L1<1>, the gate of transistor 209-14-2 can be coupled to SELL_L1<2>, and the gate of transistor 209-15-2 can be coupled to SELL_L1<3>, in the same manner as transistors 209-N-2, N=0, 1, 2, and 3. The gates of transistors 209-N-1, for each N=12, 13, 14, and 15, can each be coupled to the same plate select line, similar to transistors 207-N-1, for each N=0, 1, 2, and 3, but to a different one of SELL_L2<N>, N=0, 1, 2, 3, specifically to SELL_L2<3>.

FIG. 3 shows a table 300 illustrating signals on plate select lines of arrangement 200 of FIGS. 2A-2B to activate a plate <N> of a Nth subarray corresponding to a PL<N> coupled to output node 235-N of plate line driver 205-N. The signals are high state signals H and low state signals L. Plates <N>, N=0, 1, 2, and 3, correspond to a first group of plate line drivers having plate drivers 205-N, N=0, 1, 2, and 3, of FIGS. 2A-2B. Plates <N>, N=4, 5, 6, and 7, correspond to a second group of plate line drivers having plate line drivers 205-N, N=4, 5, 6, and 7, of FIGS. 2A-2B. Plates <N>, N=8, 9, 10, and 11, correspond to a third group of plate line drivers having plate line drivers 205-N, N=8, 9, 10, and 11, of FIGS. 2A-2B. Plates <N>, N=12, 13, 14, and 15, correspond to a fourth group of plate line drivers having plate line drivers 205-N, N=12, 13, 14, and 15, of FIGS. 2A-2B.

Figure 4:
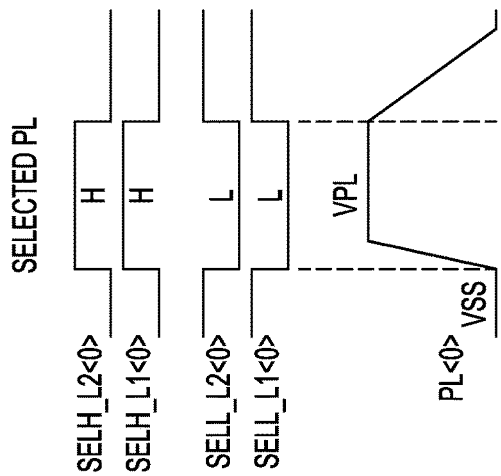
FIG. 4 illustrates, for the arrangement of FIGS. 2A-2B, a set of high state signals and low state signals to be placed on a set of plate select lines to select the zeroth plate line of the arrangement, according to various embodiments.

FIG. 4 illustrates, for arrangement 200 of FIGS. 2A-2B, a set of high state signals and low state signals to be placed on set 215 of plate select lines to select PL<0>. Prior to applying high state signals and low state signals to turn on or turn off transistors of the PL driver 205-0 for selected PL<0>, SELH_L2<0> and SELH_L1<0> of subset 215-1 of plate select lines and SELL_L2<0> and SELL_L1<0> of subset 215-2 of plate select lines are at respective baseline voltages. High state signals can be positive with respect to the baseline and low state signals can be negative with respect to the baseline. The baseline voltages can be, but are not limited to, zero volts. A baseline signal to a gate of a transistor 207-N-1 and a baseline signal to a gate of a transistor 207-N-2 can place transistor 207-N-1 and transistor 207-N-2, respectively, in a non-conducting state, while a high state signal to a gate of a transistor 207-N-1 and a high state signal to a gate of a transistor 207-N-2 can place transistor 207-N-1 and transistor 207-N-2, respectively, in a conducting state. A baseline signal to a gate of a transistor 209-N-1 and a baseline signal to a gate of a transistor 209-N-2 can place transistor 209-N-1 and transistor 209-N-2, respectively, in a conducting state, while a low state signal to a gate of a transistor 209-N-1 and a low state signal to a gate of a transistor 209-N-2 can place transistor 209-N-1 and transistor 209-N-2, respectively, in a non-conducting state. In the application of signals shown in FIG. 4, a high state signal is applied to SELH_L2<0> and SELH_L1<0>, and a low state signal is applied to SELL_L2<0> and SELL_L1<0>. The voltage on PL<0> rises over time from VSS to VPL with the NOR gate arrangement of parallel transistors 209-0-1 and 209-02 cutting off current flow to bias transistor 211-0 from VPL node 219. When the high state voltages and low state voltages are returned to the baseline, VPL node 219 is decoupled from output node 235-0, output node 235-0 is coupled to VSS node 201 through bias transistor 211-0, and the voltage on PL<0> decreases over time from VPL to VSS.

Figure 5:
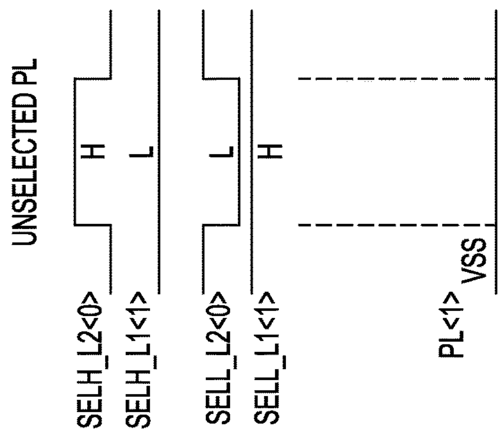
FIG. 5 illustrates, for the arrangement of FIGS. 2A-2B, a set of high state signals and low state signals to be placed on a set of plate select lines for a first plate line of the arrangement as unselected, according to various embodiments.

FIG. 5 illustrates, for arrangement 200 of FIGS. 2A-2B, a set of high state signals and low state signals to be placed on a set 215 of plate select lines for PL<1> as unselected. Prior to applying high state signals and low state signals to turn on or turn off transistors of the PL driver 205-1 for PL<1> as unselected, SELH_L2<0> and SELH_L1<1> of subset 215-1 of plate select lines and SELL_L2<0> and SELL_L1<1> of subset 215-2 of plate select lines are at respective baseline voltages. The baseline voltages can be, but are not limited to, zero volts. A high state signal is applied to SELH_L2<0> and SELL_L1<1>, and a low state signal is applied to SELH_L1<1> and SELL_L2<0>. High state signals can be positive with respect to the baseline and low state signals can be negative with respect to the baseline. The voltage on PL<1> remains at VSS with the NOR gate arrangement of parallel transistors 209-1-1 and 209-1-2 connecting output node 235-1 to VSS at VSS node 201 through bias transistor 211-1. When the high state voltages and low state voltages are returned to the baseline, the voltage on PL<1> remains at VSS. In various embodiments, when a signal on a high select line is a low state signal, the low state signal can be the baseline for the high select line, and when a signal on a low select line is a high state signal, the high state signal can be the baseline for the low select line. The signals on SELH_L2<0> and SELH_L1<1> disconnect output node 235-1 from VPL, and the signals on SELL_L2<0> and SELL_L1<1> connect output node 235-1 to VSS of VSS node 201 through bias transistor 111-5.

Figure 6:
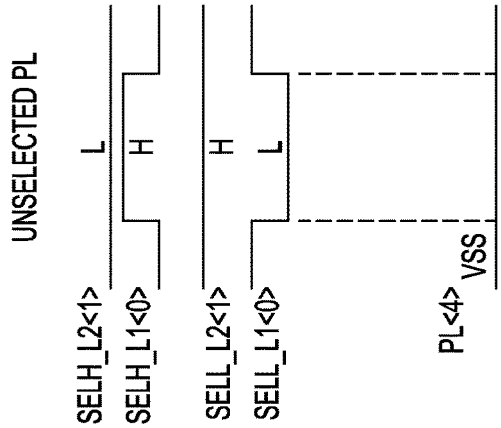
FIG. 6 illustrates, for the arrangement of FIGS. 2A-2B, a set of high state signals and low state signals to be placed on a set of plate select lines for a fourth plate line of the arrangement as unselected, according to various embodiments.

FIG. 6 illustrates, for arrangement 200 of FIGS. 2A-2B, a set of high state signals and low state signals to be placed on a set of plate select lines for PL<4> as unselected. Prior to applying high state signals and low state signals to turn on or turn off transistors of the PL driver 205-4 for PL<4>, SELH_L2<1> and SELH_L1<0> of subset 215-1 of plate select lines and SELL_L2<1> and SELL_L1<0> of subset 215-2 of plate select lines are at respective baseline voltages. The baseline voltages can be, but are not limited to, zero volts. A high state signal is applied to SELH_L1<0> and SELL_L2<1>, and a low state signal is applied to SELH_L2<1> and SELL_L1<0>. High state signals can be positive with respect to the baseline and low state signals can be negative with respect to the baseline. In various embodiments, when a signal on a high select line is a low state signal, the low state signal can be the baseline for the high select line, and when a signal on a low select line is a high state signal, the high state signal can be the baseline for the low select line. The voltage on PL<4> remains at VSS with the NOR gate arrangement of parallel transistors 209-4-1 and 209-4-2 connecting output node 235-4 to VSS at VSS node 201 through bias transistor 211-4. When the high state voltages and low state voltages are returned to the baseline, the voltage on PL<4> remains at VSS. The signals on SELH_L2<1> and SELH_L1<0> disconnect output node 235-4 from VPL node 219, and the signals on SELL_L2<1> and SELL_L1<0> connect output node 235-4 to VSS of VSS node 201 through bias transistor 211-N.

Figure 7:
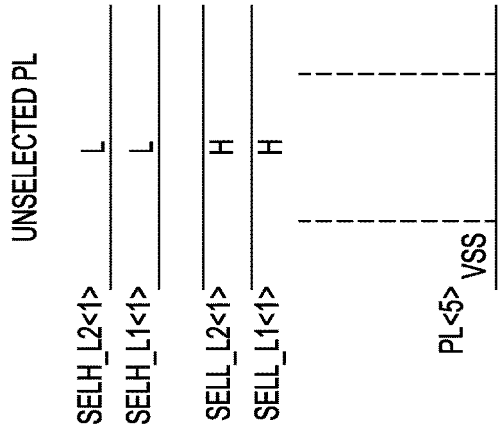
FIG. 7 illustrates, for the arrangement of FIGS. 2A-2B, a set of high state signals and low state signals to be placed on a set of plate select lines for a fifth plate line of the arrangement as unselected, according to various embodiments.

FIG. 7 illustrates, for arrangement 200 of FIGS. 2A-2B, a set of high state signals and low state signals to be placed on a set of plate select lines for PL<5> as unselected. Prior to applying high state signals and low state signals to turn on or turn off transistors of the PL driver 205-5 for PL<5>, SELH_L2<1> and SELH_L1<1> of subset 215-1 of plate select lines and SELL_L2<1> and SELL_L1<1> of subset 215-2 of plate select lines are at respective baseline voltages. The baseline voltages can be, but are not limited to, zero volts. In various embodiments, when a signal on a high select line is a low state signal, the low state signal can be the baseline for the high select line, and when a signal on a low select line is a high state signal, the high state signal can be the baseline for the low select line. A high state signal is applied to SELL_L1<1> and SELL_L2<1>, and a low state signal is applied to SELH_L2<1> and SELL_L1<1>. High state signals can be positive with respect to the baseline and low state signals can be negative with respect to the baseline. The voltage on PL<5> remains at VSS with the NOR gate arrangement of parallel transistors 209-5-1 and 209-5-2 connecting output node 235-5 to VSS at VSS node 201 through bias transistor 211-5. When the high state voltages and low state voltages are returned to the baseline, the voltage on PL<5> remains at VSS. The signals on SELH_L2<1> and SELH_L1<1> disconnect output node 235-5 from VPL node 219, and the signals on SELL_L2<1> and SELL_L1<1> connect output node 235-5 to VSS of VSS node 201 through bias transistor 211-5.

Each plate associated with the memory array of the memory device arranged as subarrays with arrangement 200 can be individually selected in the same manner as the plate of FIG. 4 using Table 300 of FIG. 3. The unselected plates corresponding to arrangement 200 can be placed in the unselected status with series arrangement of 207-N-1 and 207-N-2 controlled to prevent output node 235-N from connecting to VPL and the parallel arrangement of 209-N-1 and 209-N-2 controlled to connect node 235-N from connect to VSS when bias transistor 211-N is on and coupled to VSS node 201.

Example arrangement 200 of FIGS. 2A-2B is a two level decode, but more levels of decoding can further reduce the signal routing. More levels of decoding may be appropriate to balance device counts and routing of plate select lines. The plate select lines can be arranged in number in accordance with the number of transistors in each PL driver. Each plate driver can include M transistors, with M being an integer equal to or greater than two, in a physical series arrangement with the series arrangement coupled to an arrangement of M transistors in a parallel arrangement with each other such that the series arrangement can be coupled in a series arrangement with a bias transistor. Output from each PL driver can be directed to a PL from a node common to one of the transistors of the series arrangement and the transistors of the parallel arrangement. The number of M is limited by the architecture of the memory device. For example, an arrangement can be implemented with three transistors in series coupled in a series arrangement of three transistors arranged in a parallel arrangement with each other with the parallel arrangement coupled to a bias device of the PL driver.

In arrangement 200 of FIGS. 2A-2B, each of PL drivers 205-0, 205-1, 205-2, 205-3 . . . 205-12, 205-13, 205-14, and 205-15 (105-N, N=0, 1 . . . 15) includes a bias transistor 211-N. Each of these PL drivers should operate within the same specifications. If the footprint (product of length and width of the transistor) of the bias device is small, a threshold voltage (Vth) mismatch across multiple PL driver devices can be large and can result in a PL slew rate variation.

In various embodiments, a bias device can be implemented that is common to all PL drivers. Sharing a single bias device to provide bias current can allow enough room to increase the length and width of the bias device to provide robust current across multiple PL drivers. Alternatively, a number of bias devices less than the number of PL drivers can be implemented with a different bias device for a different subset of the PL drivers. In addition, a number of different architectures or formats for the PL drivers can be implemented to operate with a bias device, where the architecture or format can be the same for each PL driver to a given memory array.

Figure 8A:
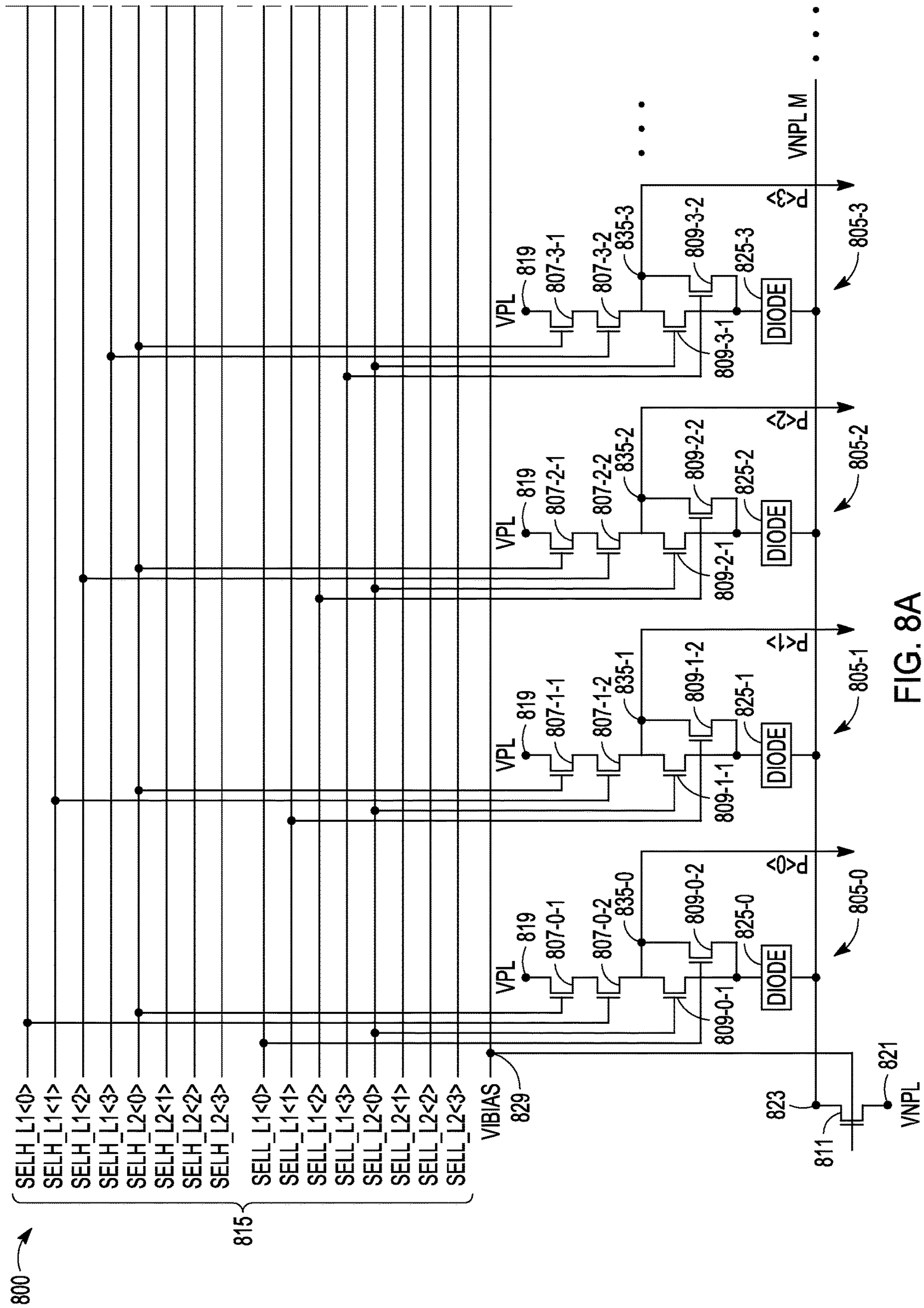
FIGS. 8A-8B illustrate an example arrangement of plate select lines and plate line drivers for subarrays of a memory array of a memory device with a bias device common to the plate line drivers, according to various embodiments.
Figure 8B:
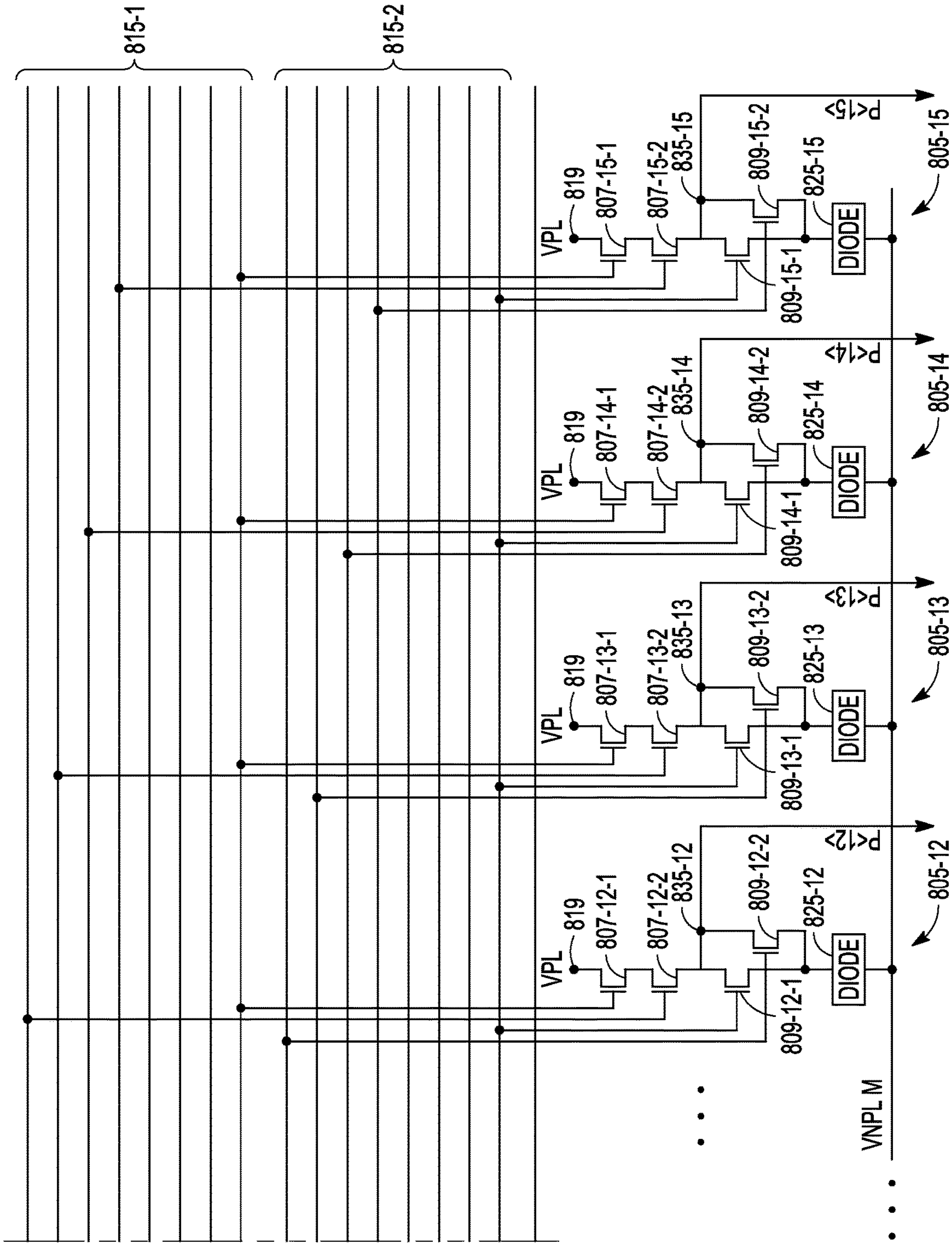

FIGS. 8A-8B illustrate an example arrangement 800 of plate select lines and PL drivers for subarrays of a memory array of a memory device with a bias device common to the plate line drivers. Arrangement 800 provides multilevel decoding that reduces the routing of the plate select lines relative to a conventional approach and uses a single bias device for the PL drivers. For example, for an arrangement of sixteen PL drivers, arrangement 800 can reduce the number of routing plate select lines by half compared to conventional arrangement 100 of routing plate select lines of FIG. 1. The coupling of the plate select lines to the PL drivers of arrangement 800 follows the coupling of the plate select lines to the PL drivers of arrangement 200, but provides for a single common bias device that can provide a robust current across the multiple PL drivers of arrangement 800.

In the example of FIGS. 8A-8B, arrangement 800 includes a set 815 of sixteen plate select lines arranged as subsets 815-1 and 815-2 with each subset 815-1, 815-2 having eight plate select lines. Subset 815-1 can form a high side group of plate select lines, which can also be referenced as a positive side of plate select lines, where subset 815-1 can be arranged into two additional subsets. The two additional subsets of subset 815-1 can be arranged, for coupling to PL drivers to carry signals, as select high lines SELH_L1<N>, where N=0, 1, 2, 3, and select high lines SELH_L2<N>, where N=0, 1, 2, 3. Subset 815-2 can form a low side group of plate select lines, which can also be referenced as a negative side of plate select lines, where subset 815-2 can be arranged into two additional subsets. The two additional subsets of subset 815-2 can be arranged, for coupling to PL drivers to carry signals, as select low lines SELL_L1<N>, where N=0, 1, 2, 3, and select high lines SELL_L2<N>, where N=0, 1, 2, 3.

Arrangement 800 includes PL drivers 805-0, 805-1, 805-2, 805-3 . . . 805-12, 805-13, 805-14, and 805-15 (805-N, N=0, 1 . . . 15) coupled to set 815 of plate select lines and coupled to PL<0>, PL<1>, PL<2>, PL<3> . . . PL<12>, PL<13>, PL<14>, and PL<15>, respectively, that couples to sixteen subarrays (the subarrays are not shown). Each PL driver 805-N has an output node 835-N coupled to a plate line PL<N> directed to a subarray of the memory array of the memory device. Each PL driver 805-N includes a transistor 807-N-1, a transistor 807-N-2, a transistor 809-N-1, a transistor 809-N-2, and a diode 825-N. Transistor 807-N-1 and transistor 807-N-2 can be structured in a series arrangement with each other, and transistor 809-N-1 and transistor 809-N-2 can be structured in a parallel arrangement with each other. The parallel arrangement of transistor 809-N-1 and transistor 809-N-2 can be in a series arrangement with transistor 807-N-1 and transistor 807-N-2, such that the parallel arrangement of transistor 809-N-1 and transistor 809-N-2 provides a NOR gate to the series arrangement of transistor 807-N-1 and transistor 807-N-2. The parallel arrangement of transistor 809-N-1 and transistor 809-N-2 can be coupled to transistor 807-N-2 at output node 835-N of PL driver 805-N. The series arrangement of transistor 807-N-1, transistor 807-N-2, the parallel arrangement of transistor 809-N-1 and transistor 809-N-2, and the diode 825-N can be situated between a VPL node 819, where VPL node 819 is structured to receive a VPL, and a first bias node 823, where first bias node 823 is a common node to all diodes 825-N of PL drivers 805-N (N=0, 1 . . . 15). The transistors of the PL drivers 805-N, N=0, 1 . . . 15 for pull-up and pull-down can be n-channel transistors.

PL drivers 805-N (N=0, 1 . . . 15) can be coupled to a single bias transistor 811 at first bias node 823, where bias transistor 811 has a gate coupled to a voltage bias node 829 to receive a bias voltage VIBIAS. Bias transistor 811 is coupled to a second bias node 821 to receive a voltage, which voltage can be a negative voltage VNPL. VNPL can be set to a magnitude of VSS minus the Vth of diodes 825-N. First bias node 823 can be at voltage VNPL_M, which is an intermediate voltage between VPL and VNPL. VNPL_M is the drain voltage of current mirror device bias transistor 811. VNPL is constant, but VNPL_M voltage may change according to the bias current provided by bias transistor 811. Diodes 825-N can be used to keep output node 835-N at VSS for an unselected plate line. Use of diodes 825-N can also avoid voltage bumps during transients. The use of the parallel arrangement of transistor 809-N-1 and transistor 809-N-2 allows output node 835-N, coupled to the series arrangement of transistor 807-N-1 and transistor 807-N-2, to switch between VPL and VSS when VNPL is set to VSS-Vth, with a reduction of plate select lines relative to arrangement 100 of FIG. 1.

Arrangement 800 includes diode 825-N, N=0, 1 . . . 15, added for each pull down path of the parallel arrangement of transistors 809-N-1 and 809-N-2, where bias transistor 811 is shared across the sixteen PL drivers 805-N, N=0, 1 . . . 15. Diode 825-N of PL driver 805-N does not allow reverse current from the common first bias node 823 to PL driver 805-N. Each of diodes 825-N can implemented in the same manner such as a conventional diode in an integrated circuit (IC). For example, each of diodes 825-N can be fabricated as a transistor with the drain of the transistor connected to the gate of the transistor. The transistors of such diodes can be n-channel transistors. In another format, each diode 825-N can be fabricated as a p+ region in a n+ region, where the n+ region is located in a p-type substrate of the memory die.

The gates of transistor 807-N-1, transistor 807-N-2, transistor 809-N-1, and transistor 809-N-2 can be coupled to specific plate select lines to a decode an instruction for accessing a memory cell coupled to a PL<N>, with single bias transistor 811 coupled to bias node 829 to receive bias voltage VIBIAS. In this example, the gates of transistor 807-N-1 and transistor 807-N-2 can be coupled to subset 815-1 of plate select lines, and the gates of transistor 809-N-1 and transistor 809-N-2 can be coupled to subset 815-2 of plate select lines. PL drivers 805-0, 805-1 . . . 805-15 can be arranged into four groups. The gates of transistor 807-N-1 of a group can be coupled to the same one of SELH_L2<N>, where N=0, 1, 2, 3. The gates of the transistors 807-N-2 of the same group can be coupled to different plate select lines of SELH_L1<N>, where N=0, 1, 2, 3. The gates of transistors 809-N-1 of the same group can be coupled to the same one of SELL_L2<N>, where N=0, 1, 2, 3. The gates of the transistors 809-N-2 of the same group can be coupled to different plate select lines of SELL_L1<N>, where N=0, 1, 2, 3. For example, a first group of PL drivers can include PL drivers 805-0, 805-1, 805-2, and 805-3. In the first group, gates of transistors 807-N-1, for each N=0, 1, 2, and 3, can be coupled to SELH_L2<0> with gate of transistor 807-0-2 coupled to SELH_L1<0>, gate of transistor 807-1-2 coupled to SELH_L1<1>, gate of transistor 807-2-2 coupled to SELH_L1<2>, and gate of transistor 807-3-2 coupled to SELH_L1<3>. For this first group of PL drivers, gates of transistors 809-N-1, for each N=0, 1, 2, and 3, can be coupled to SELL_L2<0> with gate of transistor 809-0-2 coupled to SELL_L1<0>, gate of transistor 807-1-2 coupled to SELL_L1<1>, gate of transistor 807-2-2 coupled to SELL_L2<0>, and gate of transistor 807-3-2 coupled to SELL_L1<3>.

Each of the second group, the third group, and the fourth group can be coupled to subset 815-1 and subset 815-2 of plate select lines in a manner similar to the first group of PL drivers with the coupling to the same plate select lines changing from group to group. Consider the fourth group of PL drivers that includes PL drivers 805-12, 805-13, 205-14, and 805-15. The gate of transistor 807-12-2 is coupled to SELH_L1<0>, the gate of transistor 807-13-2 is coupled to SELH_L1<1>, the gate of transistor 807-14-2 is coupled to SELH_L1<2>, and gate of transistor 807-15-2 is coupled to SELH_L1<3>, in the same manner as transistors 807-N-2, N=0, 1, 2, and 3. The gates of transistors 807-N-1, for each N=12, 13, 14, and 15, can each be coupled to the same plate select line, similar to transistors 807-N-1, for each N=0, 1, 2, and 3, but to a different one of SELH_L2<N>, N=0, 1, 2, and 3, specifically to SELH_L2<3>. For this fourth group of PL drivers, the gate of transistor 809-12-2 is coupled to SELL_L1<0>, the gate of transistor 809-13-2 coupled to SELL_L1<1>, the gate of transistor 809-14-2 coupled to SELL_L1<2>, and the gate of transistor 809-15-2 coupled to SELL_L1<3>, in the same manner as transistors 809-N-2, N=0, 1, 2, and 3. The gates of transistors 809-N-1, for each N=12, 13, 14, and 15, can each be coupled to the same plate select line, similar to transistors 807-N-1, for each N=0, 1, 2, and 3, but to a different one of SELL_L2<N>, N=0, 1, 2, 3, specifically to SELL_L2<3>.

Table 300 of FIG. 3 illustrates signals that can be placed on plate select lines of arrangement 800 of FIGS. 8A-8B to activate a plate <N> of a Nth subarray corresponding to a PL<N> coupled to output node 835-N of PL driver 805-N. The signals are high state signals H and low state lines L. Plates <N>, N=0, 1, 2, and 3, correspond to a first group of PL drivers having PL drivers 805-N, N=0, 1, 2, and 3, of FIGS. 8A-8B. Plates <N>, N=4, 5, 6, and 7, correspond to a second group of PL drivers having PL drivers 805-N, N=4, 5, 6, and 7, of FIGS. 8A-8B. Plates <N>, N=8, 9, 10, and 11, correspond to a third group of PL drivers having PL drivers 805-N, N=8, 9, 10, and 11, of FIGS. 8A-8B. Plates <N>, N=12, 13, 14, and 15, correspond to a fourth group of PL drivers having PL drivers 805-N, N=12, 13, 14, and 15, of FIGS. 8A-8B.

Figure 9:
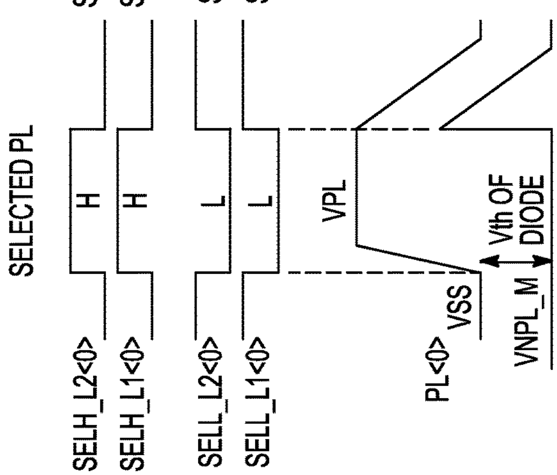
FIG. 9 illustrates, for the arrangement of FIGS. 8A-8B, a set of high state signals and low state signals to be placed on a set of plate select lines to select the zeroth plate line of the arrangement, according to various embodiments.

FIG. 9 illustrates, for the arrangement 800 of FIGS. 8A-8B, a set of high state signals and low state signals to be placed on a set of plate select lines to select PL<0>. Prior to applying high state signals and low state signals to turn on or turn off transistors of the PL driver 805-0 to select PL<0>, SELH_L2<0> and SELH_L1<0> of subset 815-1 of plate select lines and SELL_L2<0> and SELL_L1<0> of subset 815-2 of plate select lines are at respective baseline voltages. High state signals can be positive with respect to the baseline and low state signals can be negative with respect to the baseline. The baseline voltages can be, but are not limited to, zero volts. A baseline signal to a gate of a transistor 807-N-1 and a baseline signal to a gate of a transistor 807-N-2 can place transistor 807-N-1 and transistor 807-N-2, respectively, in a non-conducting state, while a high state signal to a gate of a transistor 807-N-1 and a high state signal to a gate of a transistor 807-N-2 can place transistor 807-N-1 and transistor 807-N-2, respectively, in a conducting state. A baseline signal to a gate of a transistor 809-N-1 and a baseline signal to a gate of a transistor 809-N-2 can place transistor 809-N-1 and transistor 809-N-2, respectively, in a conducting state, while a low state signal to a gate of a transistor 809-N-1 and a low state signal to a gate of a transistor 809-N-2 can place transistor 809-N-1 and transistor 809-N-2, respectively, in a non-conducting state. The voltage VNPL_M at first bias node 823, common to all diodes 825-N of PL drivers 805-N (N=0, 1 . . . 15), is at a voltage below VSS by Vth of diodes 825-N. In the application of signals shown in FIG. 9, a high state signal is applied to SELH_L2<0> and SELH_L1<0>, and a low state signal is applied to SELL_L2<0> and SELL_L1<0>. The voltage on PL<0> rises over time from VSS to VPL with the NOR gate arrangement of parallel transistors 809-0-1 and 809-02 cutting off current flow to diode 825-0 from VPL node 829. When the high state voltages and low state voltages are returned to the baseline, the voltage on PL<0> decreases over time from VPL to VSS, while VNPL_M spikes and decreases to the level that was on first bias node 823 before the high and low state signals were applied. VNPL_M may exceed VSS voltage, but does not affect the voltage on PL<0> biased to VSS due to diode 825-0, where diode 825-0 inhibits reverse current flow to output node 835-0 through the parallel arrangement of transistors 809-0-1 and 809-0-2.

Figure 10:
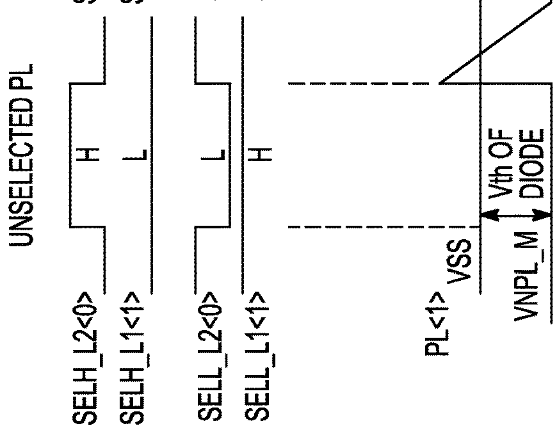
FIG. 10 illustrates, for the arrangement of FIGS. 8A-8B, a set of high state signals and low state signals to be placed on a set of plate select lines to maintain a first plate line of the arrangement as unselected, according to various embodiments.

FIG. 10 illustrates, for the arrangement 800 of FIGS. 8A-8B, a set of high state signals and low state signals to be placed on a set of plate select lines for PL<1> as unselected. Prior to applying high state signals and low state signals to turn on or turn off transistors of the PL driver 805-1 for PL<1>, SELH_L2<0> and SELH_L1<1> of subset 815-1 of plate select lines and SELL_L2<0> and SELL_L1<1> of subset 815-2 of plate select lines are at respective baseline voltages. The baseline voltages can be, but are not limited to, zero volts. The voltage VNPL_M at first bias node 823, common to all diodes 825-N of PL drivers 805-N (N=0, 1 . . . 15), is at a voltage below VSS by Vth of diodes 825-N. A high state signal is applied to SELH_L2<0> and SELL_L1<1>, and a low state signal is applied to SELH_L1<1> and SELL_L2<0>. High state signals can be positive with respect to the baseline and low state signals can be negative with respect to the baseline. In various embodiments, when a signal on a high select line is a low state signal, the low state signal can be the baseline for the high select line, and when a signal on a low select line is a high state signal, the high state signal can be the baseline for the low select line. The voltage on PL<1> remains at VSS with the NOR gate arrangement of parallel transistors 809-0-1 and 809-02 connecting output node 835-1 to VSS due to VNPL at second bias node 821 set at VSS-Vth. When the high state voltages and low state voltages are returned to the baseline, the voltage on PL<01> remains at VSS, while VNPL_M spikes and decreases to the level that was on first bias node 823 before the high and low state signals were applied. The signal on SELH_L1<1> disconnects output node 835-1 from VPL, and the signal on SELL_L2<0> connects output node 835-1 to VSS due to VNPL at second bias node 821. VNPL_M may exceed VSS voltage, but does not affect the voltage on PL<1> biased to VSS due to diode 825-1 inhibiting reverse current flow to output node 835-1 through the parallel arrangement of transistors 809-1-1 and 809-1-2.

Figure 11:
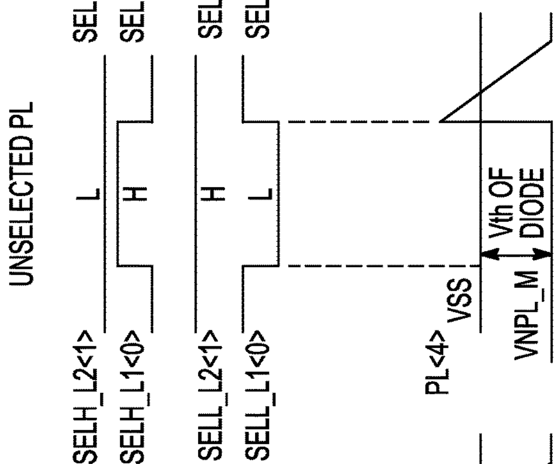
FIG. 11 illustrates, for the arrangement of FIGS. 8A-8B, a set of high state signals and low state signals to be placed on a set of plate select lines to maintain a fourth plate line of the arrangement as unselected, according to various embodiments.

FIG. 11 illustrates, for the arrangement 800 of FIGS. 8A-8B, a set of high state signals and low state signals to be placed on a set of plate select lines for PL<4> as unselected. Prior to applying high state signals and low state signals to turn on or turn off transistors of the PL driver 805-4 for PL<4>, SELH_L2<1> and SELH_L1<0> of subset 815-1 of plate select lines and SELL_L2<1> and SELL_L1<0> of subset 815-2 of plate select lines are at respective baseline voltages. The baseline voltages can be, but are not limited to, zero volts. The voltage VNPL_M at first bias node 823, common to all diodes 825-N of PL drivers 805-N (N=0, 1 . . . 15), is at a voltage below VSS by Vth of diodes 825-N. A high state signal is applied to SELH_L1<0> and SELL_L2<1>, and a low state signal is applied to SELH_L2<1> and SELL_L1<0>. High state signals can be positive with respect to the baseline and low state signals can be negative with respect to the baseline. In various embodiments, when a signal on a high select line is a low state signal, the low state signal can be the baseline for the high select line, and when a signal on a low select line is a high state signal, the high state signal can be the baseline for the low select line. The voltage on PL<4> remains at VSS with the NOR gate arrangement of parallel transistors 809-0-1 and 809-02 connecting output node 835-4 to VSS due to VNPL at second bias node 821 set at VSS-Vth. When the high state voltages and low state voltages are returned to the baseline, the voltage on PL<4> remains at VSS, while VNPL_M spikes and decreases to the constant level that was on first bias node 823 before the high and low state signals were applied. The signal on SELH_L2<1> disconnects output node 835-4 from VPL, and the signal on SELL_L1<0> connects output node 835-4 to VSS due to VNPL at second bias node 821. VNPL_M may exceed VSS voltage, but does not affect the voltage on PL<4> biased to VSS due to diode 825-4 inhibiting reverse current flow to output node 835-4 through the parallel arrangement of transistors 809-4-1 and 809-4-2.

Figure 12:
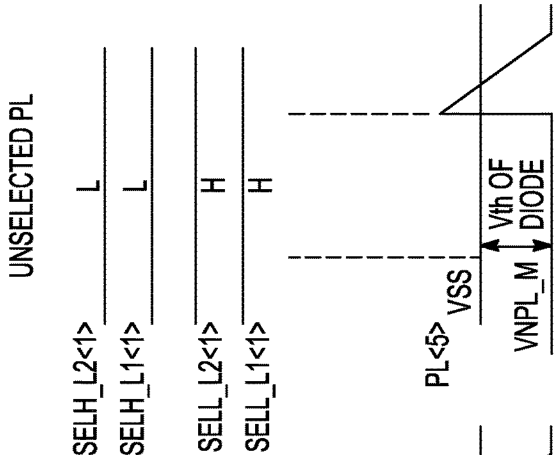
FIG. 12 illustrates, for the arrangement of FIGS. 8A-8B, a set of high state signals and low state signals to be placed on a set of plate select lines to maintain a fifth plate line of the arrangement as unselected, according to various embodiments.

FIG. 12 illustrates, for the arrangement 800 of FIGS. 8A-8B, a set of high state signals and low state signals to be placed on a set of plate select lines for PL<5> as unselected. Prior to applying high state signals and low state signals to turn on or turn off transistors of the PL driver 205-5 for selected PL<5>, SELH_L2<1> and SELH_L1<1> of subset 215-1 of plate select lines and SELL_L2<1> and SELL_L1<1> of subset 215-2 of plate select lines are at respective baseline voltages. The baseline voltages can be, but are not limited to, zero volts. The voltage VNPL_M at first bias node 823, common to all diodes 825-N of PL drivers 805-N (N=0, 1 . . . 15), is at a voltage below VSS by Vth of diodes 825-N. A high state signal is applied to SELL_L1<1> and SELL_L2<1>, and a low state signal is applied to SELH_L2<1> and SELL_L1<1>. High state signals can be positive with respect to the baseline and low state signals can be negative with respect to the baseline. In various embodiments, when a signal on a high select line is a low state signal, the low state signal can be the baseline for the high select line, and when a signal on a low select line is a high state signal, the high state signal can be the baseline for the low select line. The voltage on PL<5> remains at VSS with the NOR gate arrangement of parallel transistors 209-0-1 and 209-02 connecting output node 235-1 to VSS due to VNPL at second bias node 821 set at VSS-Vth. When the high state voltages and low state voltages are returned to the baseline, the voltage on PL<5> remains at VSS, while VNPL_M spikes and decreases to the constant level that was on first bias node 823 before the high and low state signals were applied. The signals on SELH_L2<1> and SELH_L1<1> disconnect output node 235-5 from VPL, and the signals on SELL_L2<1> and SELL_L1<1> connect output node 235-5 to VSS due to VNPL at second bias node 821. VNPL_M may exceed VSS voltage, but does not affect the voltage on PL<5> biased to VSS due to diode 825-5 inhibiting reverse current flow to output node 835-5 through the parallel arrangement of transistors 809-5-1 and 809-5-2.

Each plate associated with the memory array of the memory device arranged as subarrays with arrangement 800 can be individually selected in the same manner as the plate of FIG. 9 using Table 300 of FIG. 3. The unselected plates corresponding to arrangement 800 can be placed in the unselected status with series arrangement of 807-N-1 and 807-N-2 controlled to prevent output node 835-N from connecting to VPL and the parallel arrangement of 809-N-1 and 809-N-2 controlled to connect node 835-N to VSS when bias transistor 811 is on and coupled to VNPL at second bias node 821. Common VNPL_M may exceed VSS voltage, but does not affect the voltage on PL<0> biased to VSS due to diode 825-0 inhibiting reverse current flow to output node 835-N through the parallel arrangement of transistors 809-0-1 and 809-0-2. If no diode 825-N is placed in PL 805-N drivers (N=0, 1 . . . N), all PL<N> can be shorted together via VNPL_M. As a result of this shorting, the desired slew rate control would not work. This type of glitch on all unselected PLs can cause the unwanted disturb.

Example arrangement 800 of FIGS. 8A-8B is a two level decode, but more levels of decoding can further reduce the signal routing. More levels of decoding may be appropriate to balance device counts and routing of plate select lines. The plate select lines can be arranged in number in accordance with the number of transistors in each PL driver. Each plate driver can include M transistors, with M being an integer equal to or greater than two, in a physical series arrangement with the series arrangement coupled to an arrangement of M transistors in a parallel arrangement with each other. Output from each PL driver can be directed to a PL from a node common to one of the transistors of the series arrangement and the transistors of the parallel arrangement. The number of M is limited by the architecture of the memory device. For example, an arrangement can be implemented with three transistors in series coupled in a series arrangement of three transistors arranged in a parallel arrangement with each other with the parallel arrangement coupled to a diode of the PL driver, where a set of PL drivers are coupled to a single bias device for the set of PL drivers at a common node of the diodes of the PL drivers of the set.

Figure 13A:
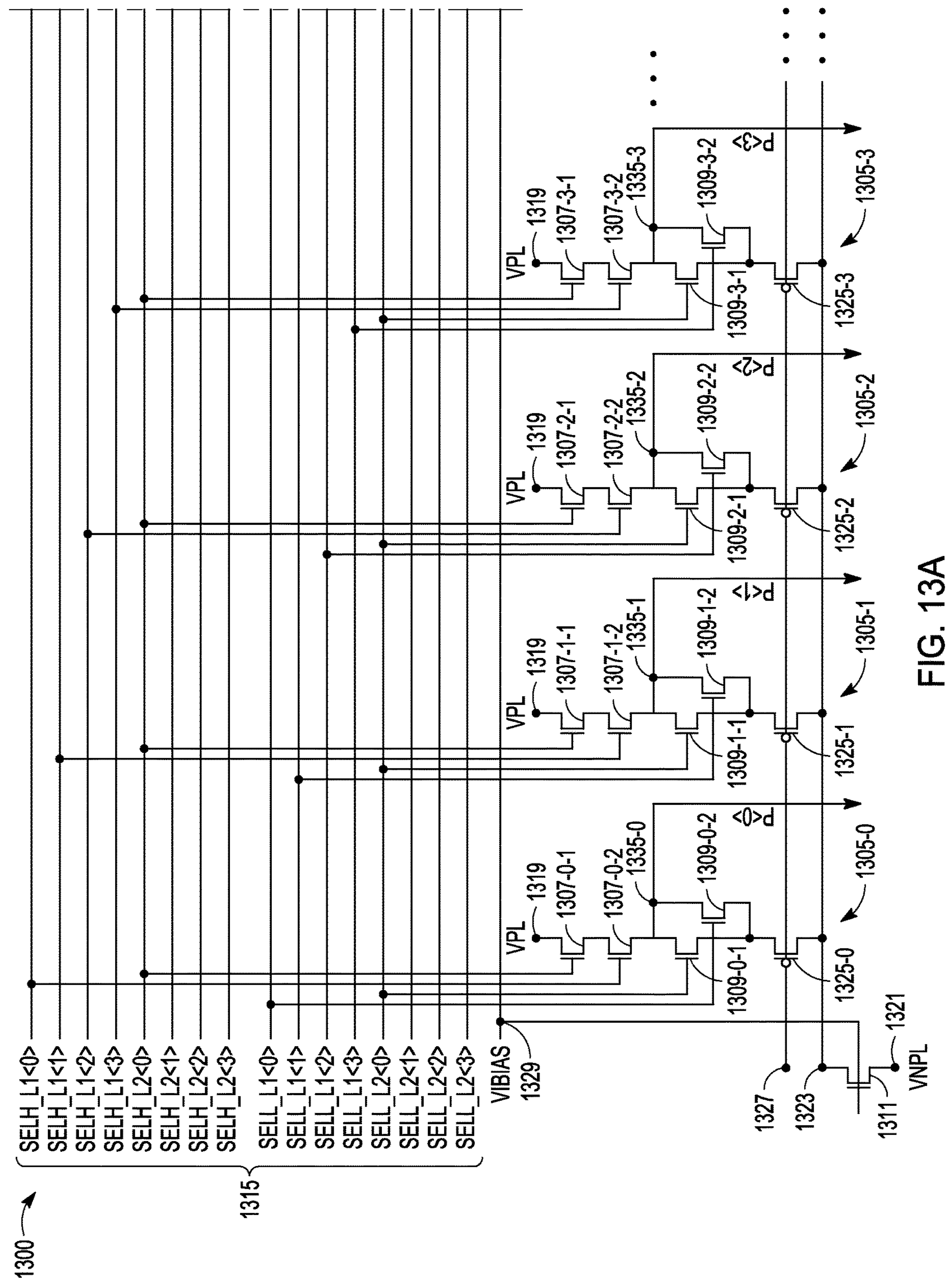
FIGS. 13A-13B illustrate an example arrangement of plate select lines and plate line drivers for subarrays of a memory array of a memory device with a bias device common to the plate line drivers, according to various embodiments.
Figure 13B:
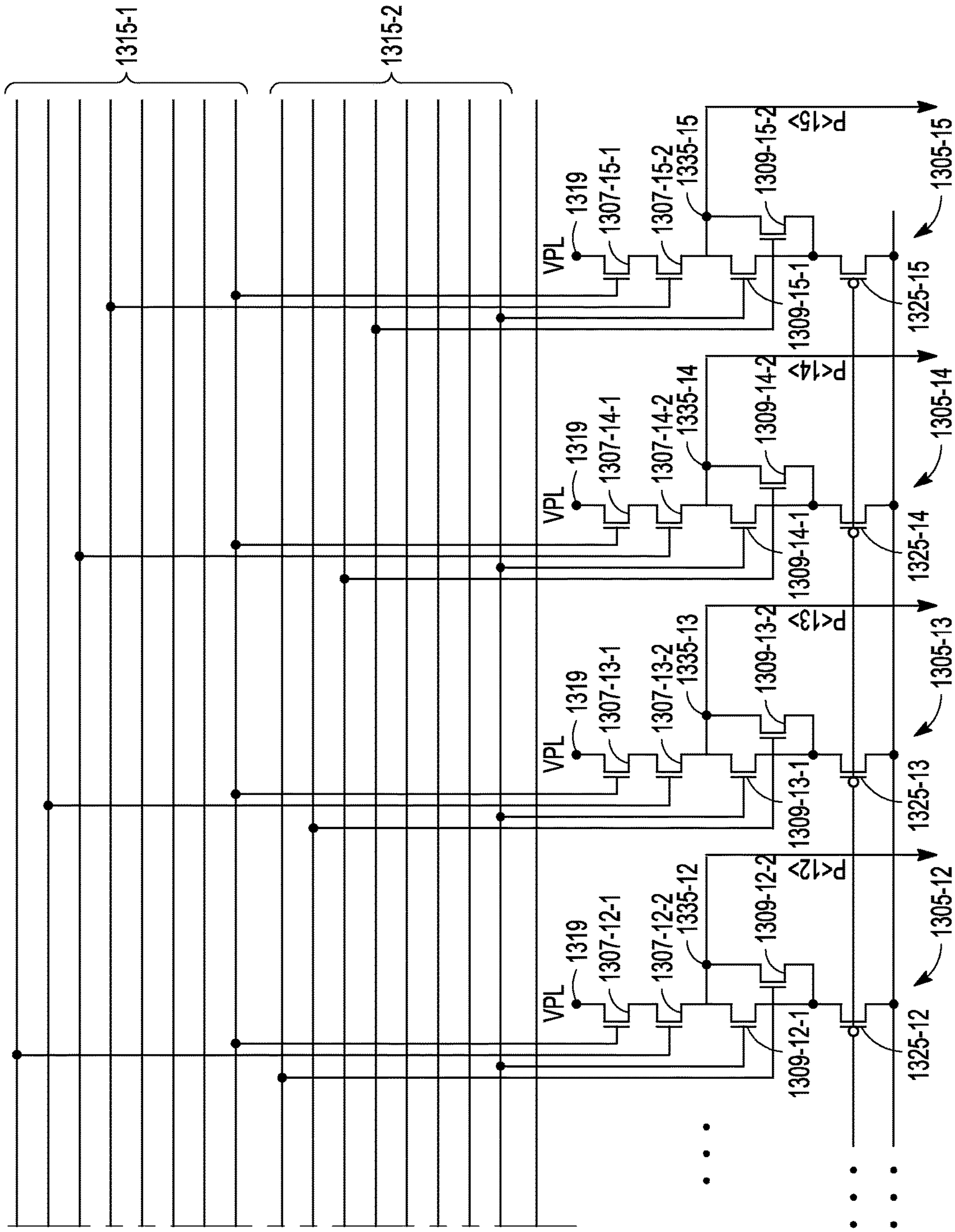

FIGS. 13A-13B illustrate an example arrangement 1300 of plate select lines and plate line drivers for subarrays of a memory array of a memory device with a bias device common to the plate line drivers. Arrangement 1300 provides multilevel decoding that reduces the routing of the plate select lines relative to a conventional approach and uses a single bias device for the PL drivers. For example, for an arrangement of sixteen PL drivers, arrangement 1300 can reduce the number of routing plate select lines by half compared to conventional arrangement 100 of routing plate select lines of FIG. 1. The coupling of the plate select lines to the PL drivers of arrangement 1300 follows the coupling of the plate select lines to the PL drivers of arrangement 200, but provides for a single common bias device that can provide a robust current across the multiple PL drivers of arrangement 1300.

In the example of FIGS. 13A-13B, arrangement 1300 includes a set 1315 of sixteen plate select lines arranged as subsets 1315-1 and 1315-2 with each subset 1315-1, 1315-2 having eight plate select lines. Subset 1315-1 can form a high side group of plate select lines, which can also be referenced as a positive side of plate select lines, where subset 1315-1 can be arranged into two additional subsets. The two additional subsets of subset 1315-1 can be arranged, for coupling to PL drivers to carry signals, as select high lines SELH_L1<N>, where N=0, 1, 2, 3, and select high lines SELH_L2<N>, where N=0, 1, 2, 3. Subset 1315-2 can form a low side group of plate select lines, which can also be referenced as a negative side of plate select lines, where subset 1315-2 can be arranged into two additional subsets. The two additional subsets of subset 1315-2 can be arranged, for coupling to PL drivers to carry signals, as select low lines SELL_L1<N>, where N=0, 1, 2, 3, and select high lines SELL_L2<N>, where N=0, 1, 2, 3.

Arrangement 1300 includes PL drivers 1305-0, 1305-1, 1305-2, 1305-3 . . . 1305-12, 1305-13, 1305-14, and 1305-15 (1305-N, N=0, 1 . . . 15) coupled to set 1315 of plate select lines and coupled to PL<0>, PL<1>, PL<2>, PL<3> . . . PL<12>, PL<13>, PL<14>, and PL<15>, respectively, that couples to sixteen subarrays (the subarrays are not shown). Each PL driver 1305-N has an output node 1335-N coupled to a plate line PL<N> directed to a subarray of the memory array of the memory device. Each driver 1305-N includes a transistor 1307-N-1, a transistor 1307-N-2, a transistor 1309-N-1, a transistor 1309-N-2, and a p-channel transistor 1325-N. With use of p-channel transistor 1325-N in PL driver 1305-N, each of transistor 1307-N-1, transistor 1307-N-2, transistor 1309-N-1, and transistor 1309-N-2 can be n-channel transistors. Depending on the architecture of the memory device having such a similar arrangement, the device types can be reversed with appropriate modifications for the device type. Transistor 1307-N-1 and transistor 1307-N-2 can be structured in a series arrangement with each other, and transistor 1309-N-1 and transistor 1309-N-2 can be structured in a parallel arrangement with each other. The parallel arrangement of transistor 1309-N-1 and transistor 1309-N-2 can be in a series arrangement with transistor 1307-N-1 and transistor 1307-N-2, such that the parallel arrangement of transistor 1309-N-1 and transistor 1309-N-2 provides a NOR gate to the series arrangement of transistor 1307-N-1 and transistor 1307-N-2. The parallel arrangement of transistor 1309-N-1 and transistor 1309-N-2 can be coupled to transistor 1307-N-2 at output node 1335-N of PL driver 1305-N. The series arrangement of transistor 1307-N-1, transistor 1307-N-2, the parallel arrangement of transistor 1309-N-1 and transistor 1309-N-2, and p-channel transistor 1325-N can be situated between a VPL node 1319, where VPL node 1319 is structured to receive a VPL, and a first bias node 1323, where first bias node 1323 is a common node to all p-channel transistors 1325-N of PL drivers 1305-N (N=0, 1 . . . 15) and is a coupling node to a bias transistor 1311. The gates of p-channel transistors 1325-N (N=0, 1 . . . N) can be coupled together in a cascode arrangement. The gates of p-channel transistors 1325-N (N=0, 1 . . . N) can be coupled to a node providing a voltage of VSS minus the Vth of the p-channel transistors to the gates, where each of p-channel transistors 1325-N (N=0, 1 . . . N) can be fabricated with the same characteristics. The VSS-Vth provided to the gates of p-channel transistors 1325-N (N=0, 1 . . . N), bias transistor can be coupled to a second bias node 1621 to receive a voltage VNPL, where VNPL can be any negative voltage. Using a p-channel metal-oxide-semiconductor (PMOS) cascode device for each pull down path of the parallel arrangement of transistors in a set of PL drivers provides another technique to share a current bias device across the set of PL drivers.

PL drivers 1305-N (N=0, 1 . . . 15) can be coupled to single bias transistor 1311 at first bias node 1323, where bias transistor 1311 has a gate coupled to a voltage bias node 1329 to receive a bias voltage VIBIAS. Bias transistor 1311 is coupled to a second bias node 1321 to receive a voltage, VNPL, which voltage can be a negative voltage. First bias node 1323 is common to all PL drivers 1305-N (N=0, 1 . . . N). The use of the parallel arrangement of transistor 1309-N-1 and transistor 1309-N-2 allows output node 1335-N, coupled to the series arrangement of transistor 1307-N-1 and transistor 1307-N-2, to switch between VPL and VSS when VNPL is set to a negative voltage and the gate of p-channel transistors 1325-N set to VSS-Vth, with a reduction of plate select lines relative to arrangement 100 of FIG. 1.

The gates of transistor 1307-N-1, transistor 1307-N-2, transistor 1309-N-1, and transistor 1309-N-2 can be coupled to specific plate select lines to a decode an instruction for accessing a memory cell coupled to a PL<N>, with single bias transistor 1311 coupled to bias node 1329 to receive bias voltage VIBIAS and coupled to first bias node 1323 common to PL drivers 1305-N (N=0, 1 . . . N). In this example, the gates of transistor 1307-N-1 and transistor 1307-N-2 can be coupled to subset 1315-1 of plate select lines, and the gates of transistor 1309-N-1 and transistor 1309-N-2 can be coupled to subset 1315-2 of plate select lines. PL drivers 1305-0, 1305-1 . . . 1305-15 can be arranged into four groups. The gates of transistor 1307-N-1 of a group can be coupled to the same one of SELH_L2<N>, where N=0, 1, 2, 3. The gates of the transistors 1307-N-2 of the same group can be coupled to different plate select lines of SELH_L1<N>, where N=0, 1, 2, 3. The gates of transistors 1309-N-1 of the same group can be coupled to the same one of SELL_L2<N>, where N=0, 1, 2, 3. The gates of the transistors 1309-N-2 of the same group can be coupled to different plate select lines of SELL_L1<N>, where N=0, 1, 2, 3. For example, a first group of PL drivers can include PL drivers 1305-0, 1305-1, 1305-2, and 1305-3. In the first group, gates of transistors 1307-N-1, for each N=0, 1, 2, and 3, can be coupled to SELH_L2<0> with gate of transistor 1307-0-2 coupled to SELH_L1<0>, gate of transistor 1307-1-2 coupled to SELH_L1<1>, gate of transistor 1307-2-2 coupled to SELH_L1<2>, and gate of transistor 1307-3-2 coupled to SELH_L1<3>. For this first group of PL drivers, gates of transistors 1309-N-1, for each N=0, 1, 2, and 3, can be coupled to SELL_L2<0> with gate of transistor 1309-0-2 coupled to SELL_L1<0>, gate of transistor 1307-1-2 coupled to SELL_L1<1>, gate of transistor 1307-2-2 coupled to SELL_L2<0>, and gate of transistor 1307-3-2 coupled to SELL_L1<3>.

Each of the second group, the third group, and the fourth group can be coupled to subset 1315-1 and subset 1315-2 of plate select lines in a manner similar to the first group of PL drivers with the coupling to the same plate select lines changing from group to group. Consider the fourth group of PL drivers that includes PL drivers 1305-12, 1305-13, 205-14, and 1305-15. The gate of transistor 1307-12-2 is coupled to SELH_L1<0>, the gate of transistor 1307-13-2 coupled to SELH_L1<1>, the gate of transistor 1307-14-2 coupled to SELH_L1<2>, and gate of transistor 1307-15-2 coupled to SELH_L1<3>, in the same manner as transistors 1307-N-2, N=0, 1, 2, and 3. The gates of transistors 1307-N-1, for each N=12, 13, 14, and 15, can each be coupled to the same plate select line, similar to transistors 1307-N-1, for each N=0, 1, 2, and 3, but to a different one of SELH_L2<N>, N=0, 1, 2, and 3, specifically to SELH_L2<3>. For this fourth group of PL drivers, the gate of transistor 1309-12-2 is coupled to SELL_L1<0>, the gate of transistor 1309-13-2 coupled to SELL_L1<1>, the gate of transistor 1309-14-2 coupled to SELL_L1<2>, and the gate of transistor 1309-15-2 coupled to SELL_L1<3>, in the same manner as transistors 1309-N-2, N=0, 1, 2, and 3. The gates of transistors 1309-N-1, for each N=12, 13, 14, and 15, can each be coupled to the same plate select line, similar to transistors 1307-N-1, for each N=0, 1, 2, and 3, but to a different one of SELL_L2<N>, N=0, 1, 2, 3, specifically to SELL_L2<3>.

Table 300 of FIG. 3 illustrates signals that can be placed on plate select lines of arrangement 1300 of FIGS. 13A-13B to activate a plate <N> of a Nth subarray corresponding to a PL<N> coupled to output node 1335-N of PL driver 1305-N. The signals are high state signals H and low state lines L. In various embodiments, when a signal on a high select line is a low state signal, the low state signal can be a baseline for the high select line, and when a signal on a low select line is a high state signal, the high state signal can be a baseline for the low select line. Plates <N>, N=0, 1, 2, and 3, correspond to a first group of PL drivers having PL drivers 1305-N, N=0, 1, 2, and 3, of FIGS. 13A-13B. Plates <N>, N=4, 5, 6, and 7, correspond to a second group of PL drivers having PL drivers 1305-N, N=4, 5, 6, and 7, of FIGS. 13A-13B. Plates <N>, N=8, 9, 10, and 11, correspond to a third group of PL drivers having PL drivers 1305-N, N=8, 9, 10, and 11, of FIGS. 13A-13B. Plates <N>, N=12, 13, 14, and 15, correspond to a fourth group of PL drivers having PL drivers 1305-N, N=12, 13, 14, and 15, of FIGS. 13A-13B.

Example arrangement 1300 of FIGS. 13A-13B is a two level decode, but more levels of decoding can further reduce the signal routing. More levels of decoding may be appropriate to balance device counts and routing of plate select lines. The plate select lines can be arranged in number in accordance with the number of transistors in each PL driver. Each plate driver can include M transistors, with M being an integer equal to or greater than two, in a physical series arrangement with the series arrangement coupled to an arrangement of M transistors in a parallel arrangement with each other. Output from each PL driver can be directed to a PL from a node common to one of the transistors of the series arrangement and the transistors of the parallel arrangement. The number of M is limited by the architecture of the memory device. For example, an arrangement of the PL driver can be implemented with three transistors in series coupled in a series arrangement of three transistors arranged in a parallel arrangement with each other, with the parallel arrangement coupled to a transistor of opposite type from the six transistors, where a set of such PL drivers can be coupled to a single bias device for the set of PL drivers at a node coupled to the transistors of opposite type.

Figure 14A:
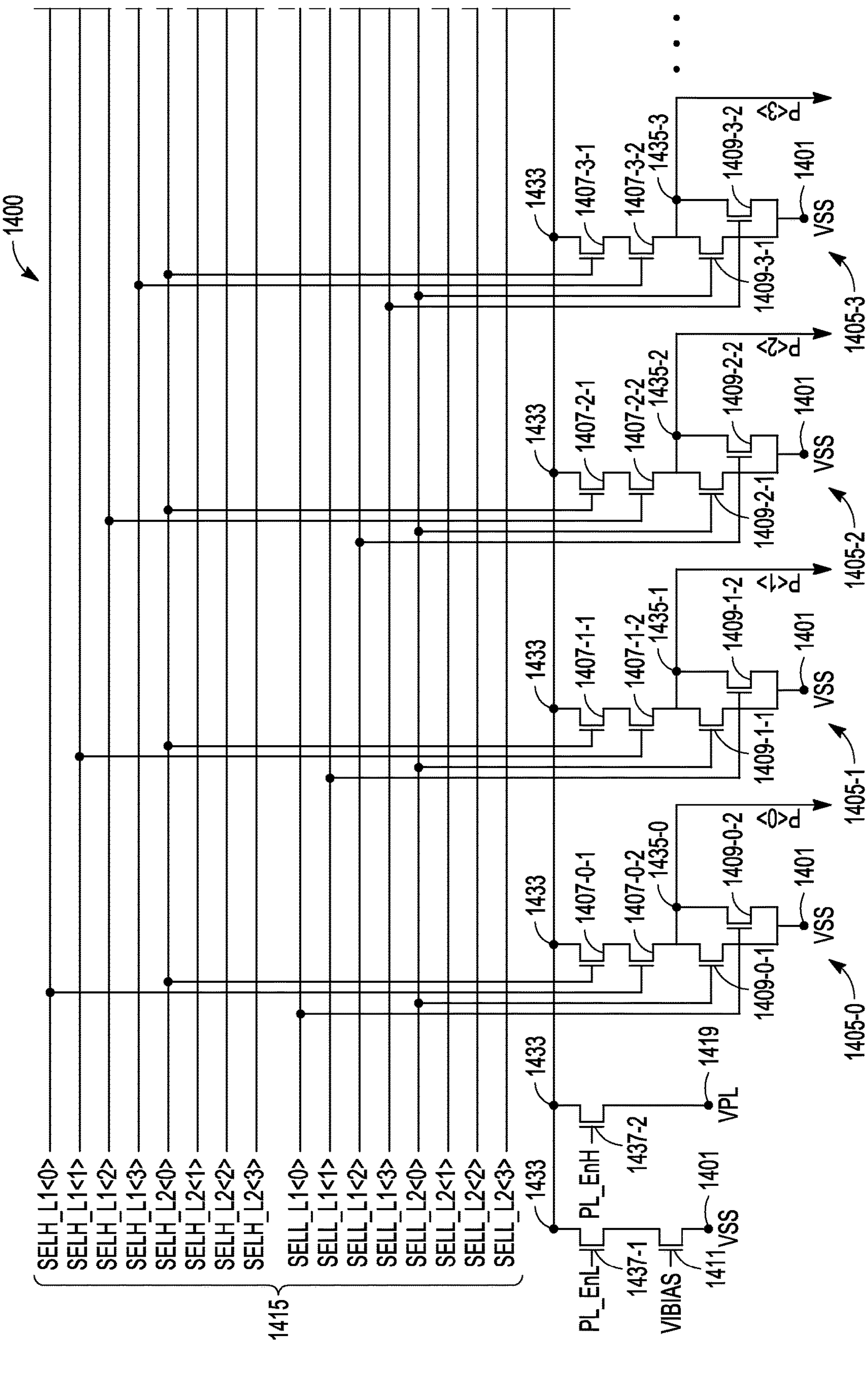
FIGS. 14A-14B illustrate an example arrangement of plate select lines and plate line drivers for subarrays of a memory array of a memory device with a bias device and a switch common to the plate line drivers, according to various embodiments.
Figure 14B:
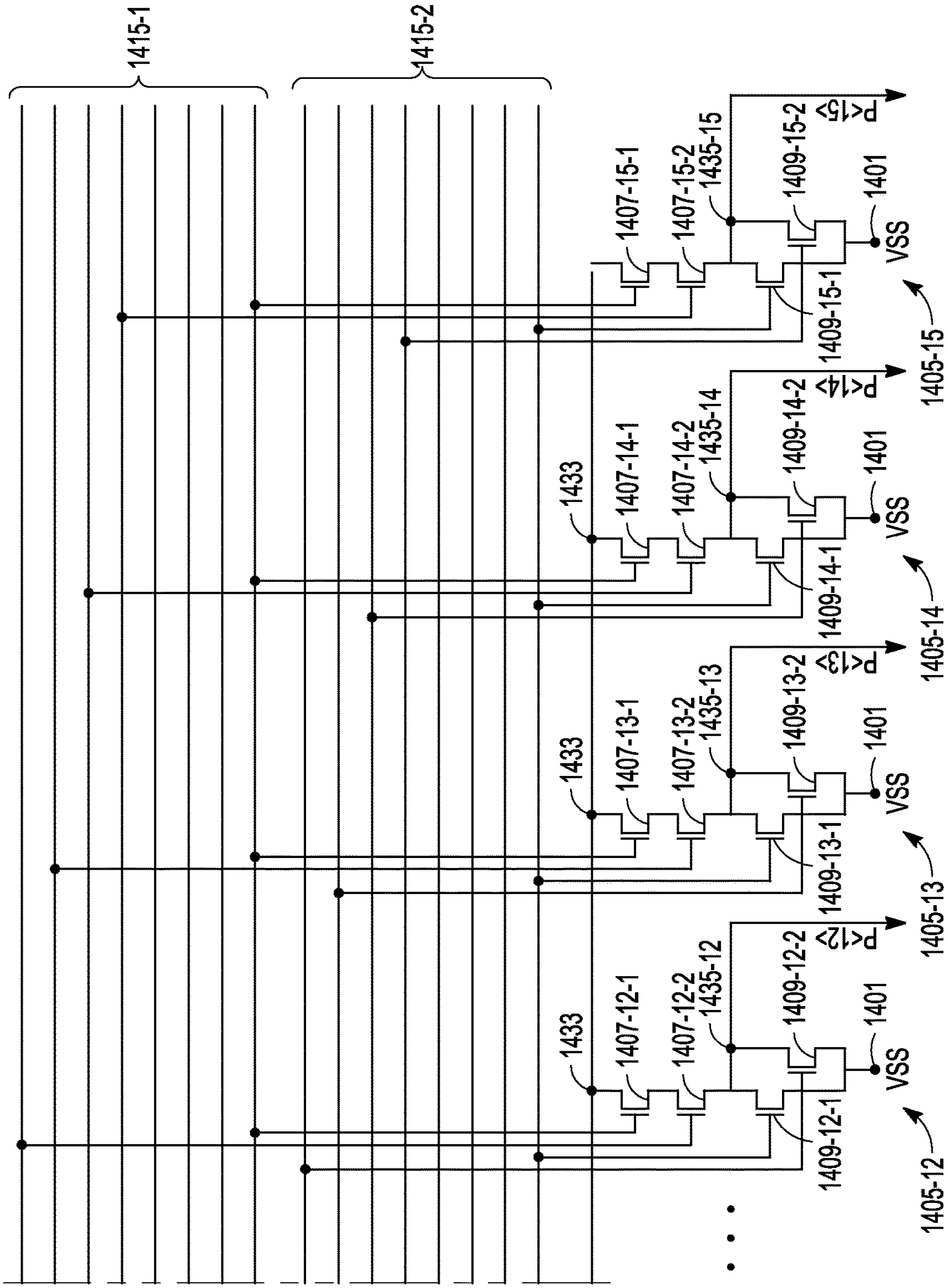

FIGS. 14A-14B illustrate an example arrangement of plate select lines and plate line drivers for subarrays of a memory array of a memory device with a bias device and a switch common to the plate line drivers. Arrangement 1400 provides multilevel decoding that reduces the routing of the plate select lines relative to a conventional approach and uses a single bias device for the PL drivers. For example, for an arrangement of sixteen PL drivers, arrangement 1400 can reduce the number of routing plate select lines by half compared to conventional arrangement 100 of routing plate select lines of FIG. 1. The coupling of the plate select lines to the PL drivers of arrangement 1400 follows the coupling of the plate select lines to the PL drivers of arrangement 200, but provides for a single common bias device that can provide a robust current across the multiple PL drivers of arrangement 1400.

In the example of FIGS. 14A-14B, arrangement 1400 includes a set 1415 of sixteen plate select lines arranged as subsets 1415-1 and 1415-2 with each subset 1415-1, 1415-2 having eight plate select lines. Subset 1415-1 can form a high side group of plate select lines, which can also be referenced as a positive side of plate select lines, where subset 1415-1 can be arranged into two additional subsets. The two additional subsets of subset 1415-1 can be arranged, for coupling to PL drivers to carry signals, as select high lines SELH_L1<N>, where N=0, 1, 2, 3, and select high lines SELH_L2<N>, where N=0, 1, 2, 3. Subset 1415-2 can form a low side group of plate select lines, which can also be referenced as a negative side of plate select lines, where subset 1415-2 can be arranged into two additional subsets. The two additional subsets of subset 1415-2 can be arranged, for coupling to PL drivers to carry signals, as select low lines SELL_L1<N>, where N=0, 1, 2, 3, and select high lines SELL_L2<N>, where N=0, 1, 2, 3.

Arrangement 1400 includes PL drivers 1405-0, 1405-1, 1405-2, 1405-3 . . . 1405-12, 1405-13, 1405-14, and 1405-15 (1405-N, N=0, 1 . . . 15) coupled to set 1415 of plate select lines and coupled to PL<0>, PL<1>, PL<2>, PL<3> . . . PL<12>, PL<13>, PL<14>, and PL<15>, respectively, that couples to sixteen subarrays (the subarrays are not shown). Each PL driver 1405-N has an output node 1435-N coupled to a plate line PL<N> directed to a subarray of the memory array of the memory device. Each driver 1405-N includes a transistor 1407-N-1, a transistor 1407-N-2, a transistor 1409-N-1, and a transistor 1409-N-2. Transistor 1407-N-1 and transistor 1407-N-2 can be structured in a series arrangement with each other, and transistor 1409-N-1 and transistor 1409-N-2 can be structured in a parallel arrangement with each other. The parallel arrangement of transistor 1409-N-1 and transistor 1409-N-2 can be in a series arrangement with transistor 1407-N-1 and transistor 1407-N-2, such that the parallel arrangement of transistor 1409-N-1 and transistor 1409-N-2 provides a NOR gate to the series arrangement of transistor 1407-N-1 and transistor 1407-N-2. The parallel arrangement of transistor 1409-N-1 and transistor 1409-N-2 can be coupled to a VSS node 1401 to receive VSS. The series arrangement of transistor 1407-N-1, transistor 1407-N-2, and the parallel arrangement of transistor 1409-N-1 and transistor 1409-N-2 can be situated between VSS node 1401 and a VPL node 1419, where VPL node 1419 is structured to receive a voltage VPL.

Each PL driver of PL drivers 1405-N (N=0, 1 . . . 15) can be coupled to a single bias transistor 1411 by a switch. The switch can be implemented as two transistors 1437-1 and 1437-2 coupled to a common switch node 1433. Switch node 1433 can be coupled to each transistor 1407-N-1 (N=0, 1 . . . 15) of each PL driver of PL drivers 1405-N (N=0, 1 . . . 15). Transistor 1437-1 can be coupled to single bias transistor 1411 and transistor 1437-2 can be coupled to a VPL node 1419, where VPL node 1419 is configured to receive a voltage VPL. The gate of transistor 1437-1 is coupled to PL_EnL and the gate of transistor 1437-2 is coupled to PL_EnH, where voltages on PL_EnL and PL_EnH are applied to turn transistor 1437-1 off and transistor 1437-2 on at the same time and turn transistor 1437-1 on and transistor 1437-2 off at the same time. With transistor 1437-1 on, each transistor 1407-N-1 (N=0, 1 . . . 15) of each PL driver of PL drivers 1405-N (N=0, 1 . . . 15) is coupled to VSS at VSS node 1401 through single bias transistor 1411 coupled to receive bias voltage VIBIAS. With transistor 1437-1 off, each transistor 1407-N-1 (N=0, 1 . . . 15) of each PL driver of PL drivers 1405-N (N=0, 1 . . . 15) is disconnected from VSS node 1401. With transistor 1437-2 on, each transistor 1407-N-1 (N=0, 1 . . . 15) of each PL driver of PL drivers 1405-N (N=0, 1 . . . 15) is coupled to VPL node 1419. With transistor 1437-2 off, each transistor 1407-N-1 (N=0, 1 . . . 15) of each PL driver of PL drivers 1405-N (N=0, 1 . . . 15) is disconnected from VPL node 1419. The use of the parallel arrangement of transistor 1409-N-1 and transistor 1409-N-2 allows output node 1435-N, coupled to the series arrangement of transistor 1407-N-1 and transistor 1407-N-2, to switch between VPL and VSS based on the switch having transistors 1437-1 and 1437-2.

The gates of transistor 1407-N-1, transistor 1407-N-2, transistor 1409-N-1, and transistor 1409-N-2 can be coupled to specific plate select lines to a decode an instruction for accessing a memory cell coupled to a PL<N>. In this example, the gates of transistor 1407-N-1 and transistor 1407-N-2 can be coupled to subset 1415-1 of plate select lines, and the gates of transistor 1409-N-1 and transistor 1409-N-2 can be coupled to subset 1415-2 of plate select lines. PL drivers 1405-0, 1405-1 . . . 1405-15 can be arranged into four groups. The gates of transistor 1407-N-1 of a group can be coupled to the same one of SELH_L2<N>, where N=0, 1, 2, 3. The gates of the transistors 1407-N-2 of the same group can be coupled to different plate select lines of SELH_L1<N>, where N=0, 1, 2, 3. The gates of transistors 1409-N-1 of the same group can be coupled to the same one of SELL_L2<N>, where N=0, 1, 2, 3. The gates of the transistors 1409-N-2 of the same group can be coupled to different plate select lines of SELL_L1<N>, where N=0, 1, 2, 3. For example, a first group of PL drivers can include PL drivers 1405-0, 1405-1, 1405-2, and 1405-3. In the first group, gates of transistors 1407-N-1, for each N=0, 1, 2, and 3, can be coupled to SELH_L2<0> with gate of transistor 1407-0-2 coupled to SELH_L1<0>, gate of transistor 1407-1-2 coupled to SELH_L1<1>, gate of transistor 1407-2-2 coupled to SELH_L1<2>, and gate of transistor 1407-3-2 coupled to SELH_L1<3>. For this first group of PL drivers, gates of transistors 1409-N-1, for each N=0, 1, 2, and 3, can be coupled to SELL_L2<0> with gate of transistor 1409-0-2 coupled to SELL_L1<0>, gate of transistor 1407-1-2 coupled to SELL_L1<1>, gate of transistor 1407-2-2 coupled to SELL_L2<0>, and gate of transistor 1407-3-2 coupled to SELL_L1<3>.

Each of the second group, the third group, and the fourth group can be coupled to subset 1415-1 and subset 1415-2 of plate select lines in a manner similar to the first group of PL drivers with the coupling to the same plate select lines changing from group to group. Consider the fourth group of PL drivers that includes PL drivers 1405-12, 1405-13, 205-14, and 1405-15. The gate of transistor 1407-12-2 is coupled to SELH_L1<0>, the gate of transistor 1407-13-2 coupled to SELH_L1<1>, the gate of transistor 1407-14-2 coupled to SELH_L1<2>, and gate of transistor 1407-15-2 coupled to SELH_L1<3>, in the same manner as transistors 1407-N-2, N=0, 1, 2, and 3. The gates of transistors 1407-N-1, for each N=12, 14, 14, and 15, can each be coupled to the same plate select line, similar to transistors 1407-N-1, for each N=0, 1, 2, and 3, but to a different one of SELH_L2<N>, N=0, 1, 2, and 3, specifically to SELH_L2<3>. For this fourth group of PL drivers, the gate of transistor 1409-12-2 is coupled to SELL_L1<0>, the gate of transistor 1409-13-2 coupled to SELL_L1<1>, the gate of transistor 1409-14-2 coupled to SELL_L1<2>, and the gate of transistor 1409-15-2 coupled to SELL_L1<3>, in the same manner as transistors 1409-N-2, N=0, 1, 2, and 3. The gates of transistors 1409-N-1, for each N=12, 13, 14, and 15, can each be coupled to the same plate select line, similar to transistors 1407-N-1, for each N=0, 1, 2, and 3, but to a different one of SELL_L2<N>, N=0, 1, 2, 3, specifically to SELL_L2<3>.

Table 300 of FIG. 3 illustrates signals that can be placed on plate select lines of arrangement 1400 of FIGS. 14A-14B to activate a plate <N> of a Nth subarray corresponding to a PL<N> coupled to output node 1435-N of PL driver 1405-N. The signals are high state signals H and low state lines L. In various embodiments, when a signal on a high select line is a low state signal, the low state signal can be a baseline for the high select line, and when a signal on a low select line is a high state signal, the high state signal can be a baseline for the low select line. Plates <N>, N=0, 1, 2, and 3, correspond to a first group of PL drivers having PL drivers 1405-N, N=0, 1, 2, and 3, of FIGS. 14A-14B. Plates <N>, N=4, 5, 6, and 7, correspond to a second group of PL drivers having PL drivers 1405-N, N=4, 5, 6, and 7, of FIGS. 14A-14B. Plates <N>, N=8, 9, 10, and 11, correspond to a third group of PL drivers having PL drivers 1405-N, N=8, 9, 10, and 11, of FIGS. 14A-14B. Plates <N>, N=12, 13, 14, and 15, correspond to a fourth group of PL drivers having PL drivers 1405-N, N=12, 13, 14, and 15, of FIGS. 14A-14B.

Figure 15:
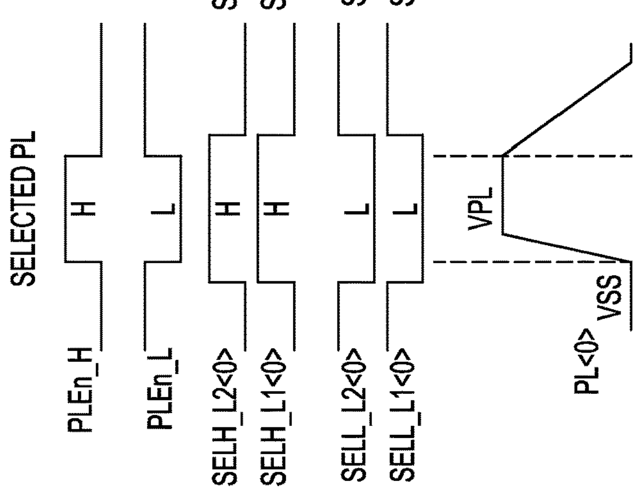
FIG. 15 illustrates, for the arrangement of FIGS. 14A-14B, a set of high state signals and low state signals to be placed on a set of plate select lines to select the zeroth plate line of the arrangement, according to various embodiments.

FIG. 15 illustrates, for the arrangement 1400 of FIGS. 14A-14B, a set of high state signals and low state signals to be placed on a set of plate select lines to select PL<0>. Prior to applying high state signals and low state signals to turn on or turn off transistors of the PL driver 1405-0 to select PL<0>, SELH_L2<0> and SELH_L1<0> of subset 1415-1 of plate select lines and SELL_L2<0> and SELL_L1<0> of subset 1415-2 of plate select lines are at respective baseline voltages. At this time frame, a baseline voltage is applied to PL_EnH that decouples switch node 1433 from VPL node 1419 and a baseline voltage is applied to PL_EnL that couples switch node 1433 to VSS node 1401, with bias transistor 1411 having a gate coupled to receive VIBIAS. The signals to PL_EnH and PL_EnL can effectively be complementary signals to turn transistors on and off. High state signals can be positive with respect to the baseline and low state signals can be negative with respect to the baseline. The baseline voltages can be, but are not limited to, zero volts. A baseline signal to a gate of a transistor 1407-N-1 and a baseline signal to a gate of a transistor 1407-N-2 can place transistor 1407-N-1 and transistor 1407-N-2, respectively, in a non-conducting state, while a high state signal to a gate of a transistor 1407-N-1 and a high state signal to a gate of a transistor 1407-N-2 can place transistor 1407-N-1 and transistor 1407-N-2, respectively, in a conducting state. A baseline signal to a gate of a transistor 1409-N-1 and a baseline signal to a gate of a transistor 1409-N-2 can place transistor 1409-N-1 and transistor 1409-N-2, respectively, in a conducting state, while a low state signal to a gate of a transistor 1409-N-1 and a low state signal to a gate of a transistor 1409-N-2 can place transistor 1409-N-1 and transistor 1409-N-2, respectively, in a non-conducting state. In the application of signals shown in FIG. 15, a high state signal is applied to SELH_L2<0> and SELH_L1<0>, and a low state signal is applied to SELL_L2<0> and SELL_L1<0>. The voltage on PL<0> rises over time from VSS to VPL at output node 1435-0 with the NOR gate arrangement of parallel transistors 1409-0-1 and 1409-0-2 cutting off current flow to Vss node 17401. When the high state voltages and low state voltages are returned to the baseline, the voltage on PL<0> decreases over time from VPL to VSS with 1409-0-1 and 1409-0-2 in a conducting state between output node 1435-0 and VSS node 1401. However, the voltages applied to PLEn_L and PLEn_H determine the timing of the PL pulse on PL<0> above VSS. The rise of voltage on PL<0> over time begins with respect to the high state signal on PLEn_H and low state signal on PLEn_L, which actuation can be after the application of the H and L voltage state signals to the given plate select lines for PL<0>. The fall of voltage on PL<0> from VPL to VSS over time begins with respect to the return to baselines voltages on PLEn_H and PLEn_H, which return can be before the termination of the H and L voltage state signals to the given plate select lines for PL<0>.

Figure 16:
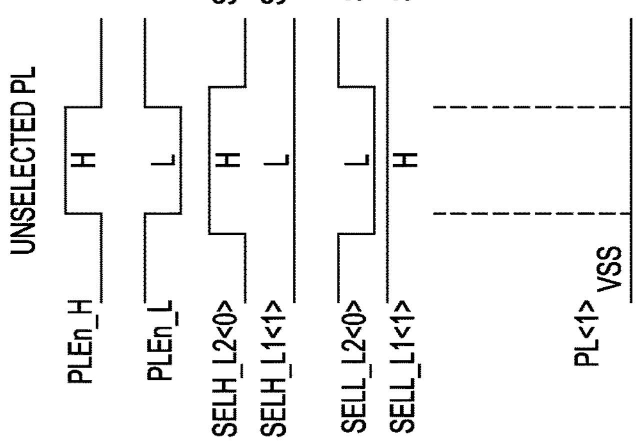
FIG. 16 illustrates, for the arrangement of FIGS. 14A-14B, a set of high state signals and low state signals to be placed on a set of plate select lines to maintain a first plate line of the arrangement as unselected, according to various embodiments.

FIG. 16 illustrates, for the arrangement 1400 of FIGS. 14A-14B, a set of high state signals and low state signals to be placed on a set of plate select lines for PL<1> as unselected. Prior to applying high state signals and low state signals to turn on or turn off transistors of the PL driver 1405-1 for PL<1>, SELH_L2<0> and SELH_L1<1> of subset 1415-1 of plate select lines and SELL_L2<0> and SELL_L1<1> of subset 1415-2 of plate select lines are at respective baseline voltages. A high state signal is applied to SELH_L2<0> and SELL_L1<1>, and a low state signal is applied to SELH_L1<1> and SELL_L2<0>. High state signals can be positive with respect to the baseline and low state signals can be negative with respect to the baseline. In various embodiments, when a signal on a high select line is a low state signal, the low state signal can be the baseline for the high select line, and when a signal on a low select line is a high state signal, the high state signal can be the baseline for the low select line. The voltage on PL<1> remains at VSS with the NOR gate arrangement of parallel transistors 1409-1-1 and 1409-1-2 connecting output node 1435-1 to VSS node 1401. When the high state voltages and low state voltages are returned to the baseline, the voltage on PL<01> remains at VSS based on the conduction state of the transistors 1409-1-1 and 1409-1-2 to VSS node 1401. For the unselected state, the signals to PL_EnH and PL_EnL of the switch formed by transistors 1437-1 and 1437-2 do not affect the maintaining of PL<0> at VSS of VSS node 1401. The signals to PL_EnH and PL_EnL of the switch affect the PL driver being selected.

Figure 17:
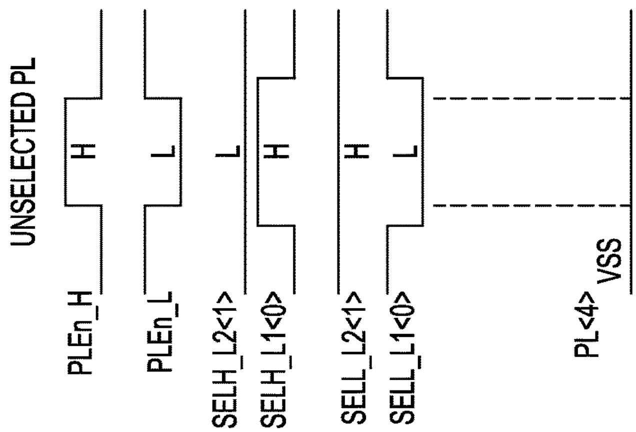
FIG. 17 illustrates, for the arrangement of FIGS. 14A-14B, a set of high state signals and low state signals to be placed on a set of plate select lines to maintain a fourth plate line of the arrangement as unselected, according to various embodiments.

FIG. 17 illustrates, for arrangement 1400 of FIGS. 14A-14B, a set of high state signals and low state signals to be placed on a set of plate select lines for PL<4> as unselected. Prior to applying high state signals and low state signals to turn on or turn off transistors of the PL driver 1405-4 for PL<4>, SELH_L2<1> and SELH_L1<0> of subset 1415-1 of plate select lines and SELL_L2<1> and SELL_L1<0> of subset 1415-2 of plate select lines are at respective baseline voltages. The baseline voltages can be, but are not limited to, zero volts. A high state signal is applied to SELH_L1<0> and SELL_L2<1>, and a low state signal is applied to SELH_L1<0> and SELL_L1<0>. High state signals can be positive with respect to the baseline and low state signals can be negative with respect to the baseline. In various embodiments, when a signal on a high select line is a low state signal, the low state signal can be the baseline for the high select line, and when a signal on a low select line is a high state signal, the high state signal can be the baseline for the low select line. The voltage on PL<4> remains at VSS with the NOR gate arrangement of parallel transistors 1409-4-1 and 1409-4-2 connecting output node 1435-4 to VSS node 1401. When the high state voltages and low state voltages are returned to the baseline, the voltage on PL<01> remains at VSS based on the conduction state of the transistors 1409-4-1 and 1409-4-2 to VSS node 1401. For the unselected state, the signals to PL_EnH and PL_EnL of the switch formed by transistors 1437-1 and 1437-2 do not affect the maintaining of PL<4> at VSS of VSS node 1401. The signals to PL_EnH and PL_EnL of the switch affect the PL driver being selected.

Figure 18:
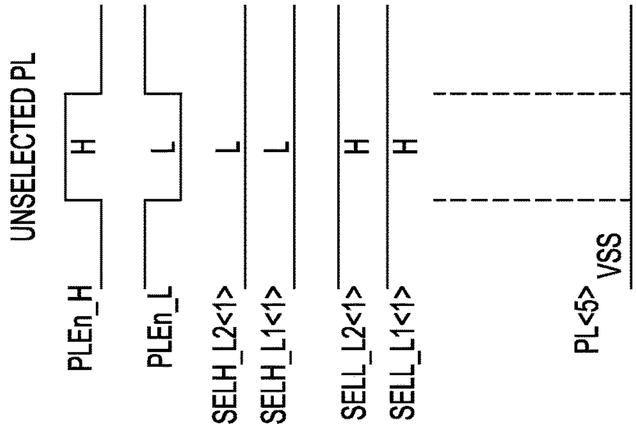
FIG. 18 illustrates, for the arrangement of FIGS. 14A-14B, a set of high state signals and low state signals to be placed on a set of plate select lines to maintain a fifth plate line of the arrangement as unselected, according to various embodiments.

FIG. 18 illustrates, for arrangement 1400 of FIGS. 14A-14B, a set of high state signals and low state signals to be placed on a set of plate select lines for PL<5> as unselected. Prior to applying high state signals and low state signals to turn on or turn off transistors of the PL driver 1405-5 for PL<5>, SELH_L2<1> and SELH_L1<1> of subset 1415-1 of plate select lines and SELL_L2<1> and SELL_L1<1> of subset 1415-2 of plate select lines are at respective baseline voltages. The baseline voltages can be, but are not limited to, zero volts. A high state signal is applied to SELL_L1<1> and SELL_L2<1>, and a low state signal is applied to SELH_L1<1> and SELL_L1<1>. High state signals can be positive with respect to the baseline and low state signals can be negative with respect to the baseline. In various embodiments, when a signal on a high select line is a low state signal, the low state signal can be the baseline for the high select line, and when a signal on a low select line is a high state signal, the high state signal can be the baseline for the low select line. The voltage on PL<5> remains at VSS with the NOR gate arrangement of parallel transistors 1409-5-1 and 1409-5-2 connecting output node 1435-5 to VSS node 1401. When the high state voltages and low state voltages are returned to the baseline, the voltage on PL<01> remains at VSS based on the conduction state of the transistors 1409-5-1 and 1409-5-2 to VSS node 1401. For the unselected state, the signals to PL_EnH and PL_EnL of the switch formed by transistors 1437-1 and 1437-2 do not affect the maintaining of PL<0> at VSS of VSS node 1401. The signals to PL_EnH and PL_EnL of the switch affect the PL driver being selected.

Example arrangement 1400 of FIGS. 14A-14B is a two level decode, but more levels of decoding can further reduce the signal routing. More levels of decoding may be appropriate to balance device counts and routing of plate select lines. The plate select lines can be arranged in number in accordance with the number of transistors in each PL driver. Each plate driver can include M transistors, with M being an integer equal to or greater than two, in a physical series arrangement with the series arrangement coupled to an arrangement of M transistors in a parallel arrangement with each other. Output from each PL driver can be directed to a PL from a node common to one of the transistors of the series arrangement and the transistors of the parallel arrangement. The number of M is limited by the architecture of the memory device. For example, an arrangement of the PL driver can be implemented with three transistors in series coupled in a series arrangement of three transistors arranged in a parallel arrangement with each other, with a first transistor of the three transistors in series coupled to a single bias device by a switch, where a set of such PL drivers can be coupled to the single bias device by the switch for the set of PL drivers.

Figure 19:
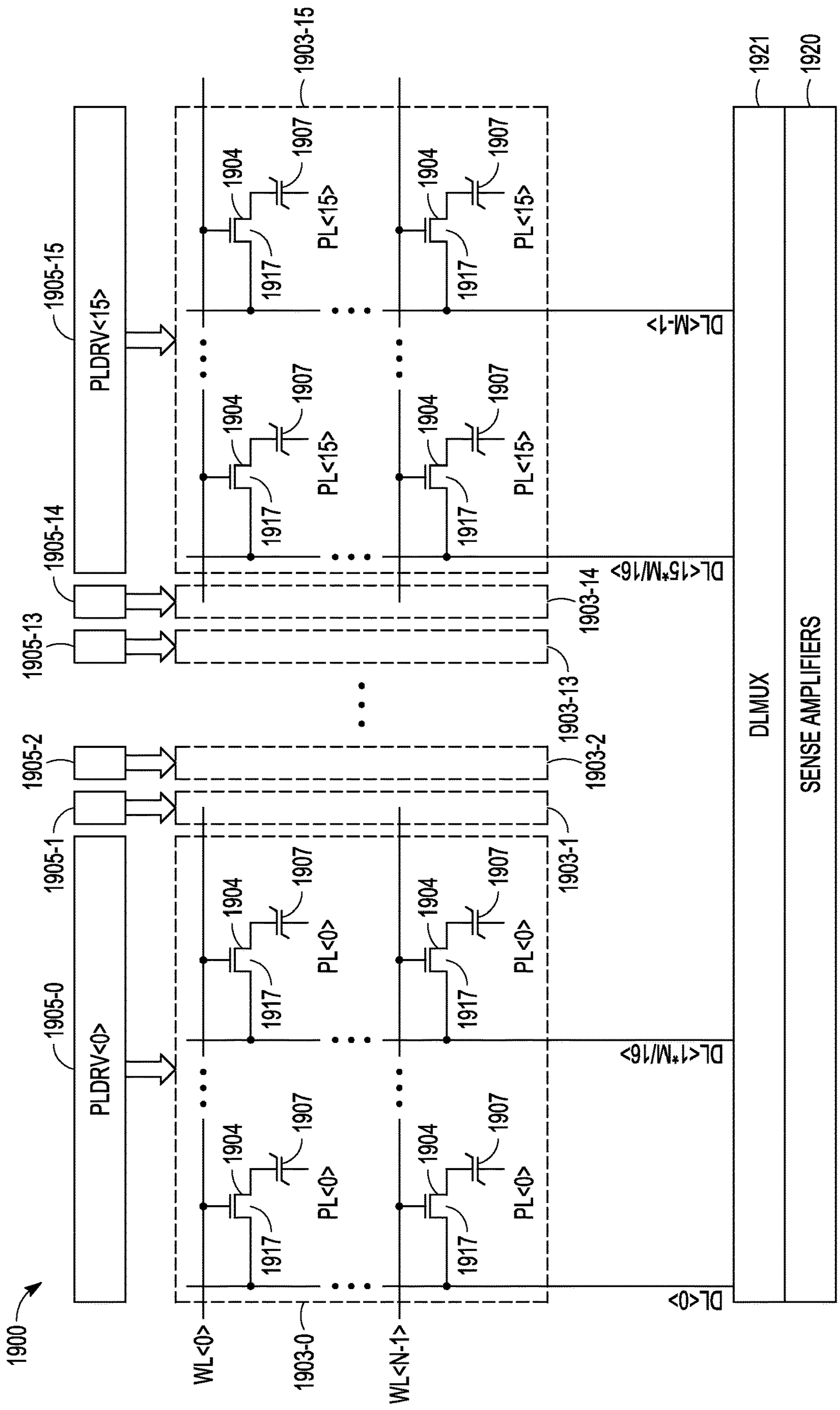
FIG. 19 is a schematic of an example memory device that can include an architecture having a memory array arranged in subarrays of memory cells, where a memory cell includes a plate line coupled to a plate of a capacitor arranged as a storage unit of the memory cell of a memory device, according to various embodiments.

FIG. 19 is a schematic of an embodiment of an example memory device 1900 that can include an architecture having a memory array arranged in subarrays 1903-0, 1903-1, 1903-2 . . . 1903-13, 1903-14, and 1903-15, which can be structured in conjunction with an arrangement of plate line selects and plate line drivers similar to arrangement 200 of FIGS. 2A-2B, arrangement 800 of FIGS. 8A-8B, arrangement 1300 of FIGS. 13A-13B, arrangement 1400 of FIGS. 14A-14B, or combination thereof. Though sixteen subarrays are shown in FIG. 19, memory device 1900 can have more or fewer than sixteen subarrays with an arrangement of plate line selects and plate line drivers adjusted according to the number of subarrays. Memory device 1900 can be, but is not limited to, a FERAM. Memory device 1900 can be implemented in a variety of electronic devices.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc. Electronic devices can be broken down into several main components: a processor (e.g., a central processing unit (CPU) or other main processor); memory (e.g., one or more volatile or non-volatile RAM memory device, such as FeRAM, DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc. As used herein, "processor" means a computational circuit including a group of processors or multi-core devices.

Each subarray of subarrays 1903-0, 1903-1, 1903-2 . . . 1903-13, 1903-14, and 1903-15 of memory device 1900 can include an array of memory cells 1904 (single labels being used to show the components of a memory cell for ease of presentation) arranged in rows and columns, where each row is an access line and each column is a data line. Memory device 1900 can include access lines WL<0> . . . WL<N-1> and data lines DL<0> . . . DL<M-1>, where each memory cell is coupled to one access line of access lines WL<0> . . . WL<N-1> and one data line of DL<0> DL<M-1>. Each memory cell 1904 can include a transistor 1917 having a gate coupled to a given access line, a drain/source of transistor 1917 coupled to a given data line, and a drain/source of transistor 1917 coupled to a plate of a capacitor 1907 of memory cell 1904. Capacitor 1907 can be a ferroelectric device with ferroelectric material as the material between two electrode plates. Transistor 1917 operates as an access device to memory cell 1904 and capacitor 1907 operates as the data storage component of memory cell 1904, with a plate of capacitor 1907 coupled to a PL<j> assigned to the jth subarray of subarrays 1903-0, 1903-1, 1903-2 . . . 1903-13, 1903-14, and 1903-15 of memory device 1900. In various embodiments, the plate of capacitor 1907 coupled to a PL<j> can be structured as the top plate of capacitor 1907. With each capacitor in a subarray <j> coupled to the same PL<j>, the subarray <j> can be structured with a common plate to the capacitors 1907 of subarray <j>. For simplicity and ease of discussion, the array is shown in only two dimensions, but the array can be extended into the third dimension.

Memory device 1900 includes plate drivers 1905-0, 1905-1, 1905-2 . . . 1905-13, 1905-14, 1905-15. For each N=0, 1, 2 . . . 13, 14, and 15, plate driver 1905-N (PLDRV<N>) is coupled to subarray <N> providing a signal on PL<N> to the plate for subarray <N> to select or unselect the PL<N> for activation of a selected plate of the subarrays. With the arrangement of plate select lines of FIGS. 2A-2B, 8A-B, 13A-B, or 14A-B used to operate with PL drivers 1905-0, 1905-1, 1905-2 . . . 1905-13, 1905-14, 1905-15 arranged as shown in FIGS. 2A-2B, 8A-B, 13A-B, or 14A-B, the signals placed on the arrangement of plate select lines can be determined by the selected plate according to Table 3. With an arrangement of plate select lines and transistors of plate line drivers being different from FIGS. 2A-2B, 8A-B, 13A-B, or 14A-B, a set of signals can be used that are different from the set of Table 3.

Data lines from each subarray <N> can be coupled to a data line mutliplexer (DLMUX) 1921. DLMUX 1921 can be coupled to sense amplifiers 1920 to read and write to memory cells 1904 of subarrays 1903-0, 1903-1, 1903-2 . . . 1903-13, 1903-14, and 1903-15. The data lines can be grouped with respect to the subarrays. For example, memory cells 1904 of subarray 1903-0 can be coupled to data lines DL<0> . . . DL<1*M/16> and memory cells 1904 of subarray 1903-15 can be coupled to data lines DL<15*M/16> . . . DL<M-1>. With M=64, each of subarrays 1903-0, 1903-1, 1903-2 . . . 1903-13, 1903-14, and 1903-15 corresponds to four data lines for each of the sixteen subarrays.

Memory device 1900 can be implemented as an IC within a package that includes pins for receiving supply voltages (e.g., to provide the drain/source and gate voltages for the transistors 1927) and signals (including data, address, and control signals). FIG. 19 depicts memory device 1900 in simplified form to illustrate basic structural components, omitting many details of the memory cells 1904 and associated access lines WL<0> . . . WL<N-1> and data lines DL<0> . . . DL<M-1> as well as the peripheral circuitry. For example, memory device 1900 can include further peripheral circuitry, such as a memory control unit that controls the memory operations based on control signals (provided, e.g., by an external processor), additional input/output circuitry, etc. Details of such peripheral circuitry are generally known to those of ordinary skill in the art and not further discussed herein.

In two-dimensional (2D) memory arrays, the rows of access lines WL<0> . . . WL<N-1> and columns of data lines DL<0> . . . DL<M-1> of memory cells 1904 are arranged along a single horizontal plane (i.e., a plane parallel to the layers) of the semiconductor substrate, e.g., in a rectangular lattice with mutually perpendicular horizontal access lines and data lines. In 3D memory arrays, the memory cells 1904 can be arranged in a 3D lattice that encompasses multiple vertically stacked horizontal planes corresponding to multiple device tiers of a multi-tier substrate assembly, with each device tier including multiple parallel rows of memory cells 1904 whose transistor gate terminals are connected by horizontal access lines such as access lines WL<0> . . . WL<N-1>. A “device tier,” as used herein, can include multiple layers (or levels) of materials, but forms the components of memory devices of a single horizontal tier of memory cells. Data lines such as data lines DL<0> . . . DL<M-1> extend vertically through all or at least a vertical portion of the multi-tier structure, and each of the data lines DL<0> . . . DL<M-1> connects to the transistor drain/source terminals of respective vertical columns of associated memory cells 1904 at the multiple device tiers. A 3D configuration of memory cells enables further increases in bit density compared with 2D arrays.

Figure 20:
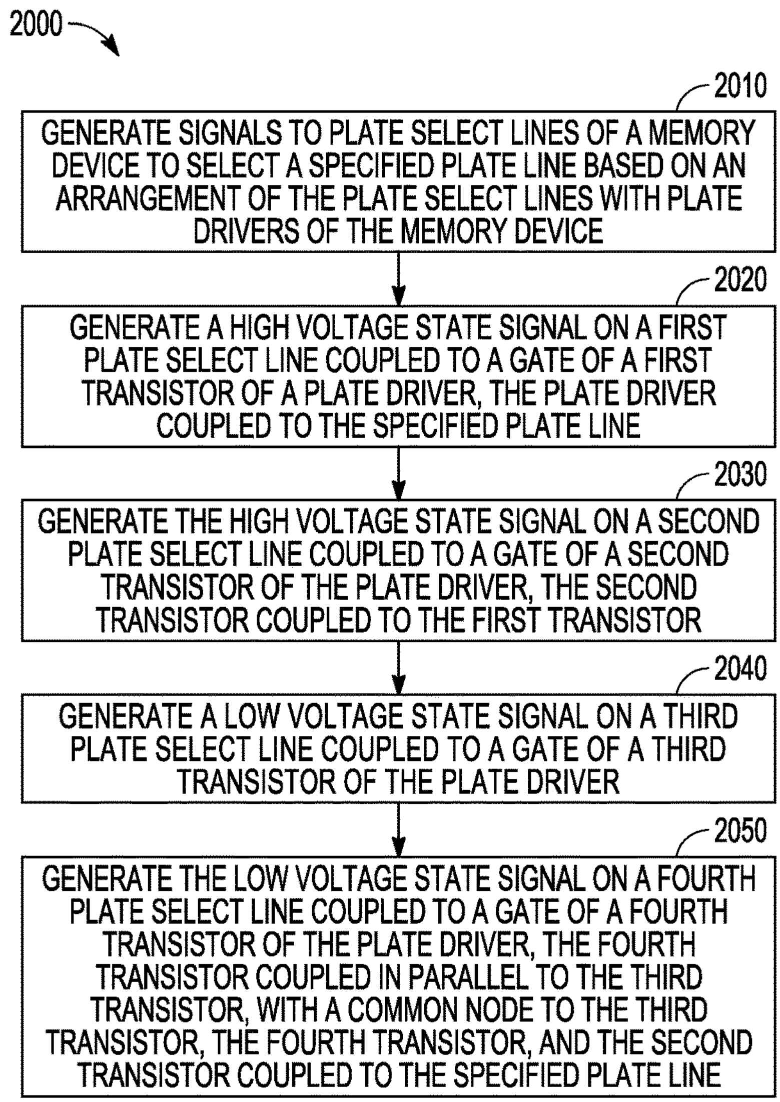
FIG. 20 is a flow diagram of features of an example method of selecting a specified plate line coupled to a plate of a capacitor arranged as a storage unit of a memory cell of a memory device, according to various embodiments.

FIG. 20 is a flow diagram of features of an embodiment of an example method of selecting a specified plate line coupled to a plate of a capacitor arranged as a storage unit of a memory cell of a memory device. The memory device has a memory array arranged as subarrays of memory cells, where each memory cell of a subarray includes a capacitor as a storage unit, with each capacitor having a plate coupled to a plate line assigned to the subarray. At 2010, signals to plate select lines of the memory device are generated to select a specified plate line based on an arrangement of the plate select lines with plate line drivers of the memory device.

At 2020, the generation of the signals includes a high voltage state signal generated on a first plate select line coupled to a gate of a first transistor of a plate line driver, where the plate line driver is coupled to the specified plate line. At 2030, the generation of the signals includes the high voltage state signal generated on a second plate select line coupled to a gate of a second transistor of the plate line driver, where the second transistor is coupled to the first transistor. The first plate select line and the second plate select line are situated in a first set of the plate select lines.

At 2040, the generation of the signals includes a low voltage state signal generated on a third plate select line coupled to a gate of a third transistor of the plate line driver. At 2050, the low voltage state signal is generated on a fourth plate select line coupled to a gate of a fourth transistor of the plate line driver, where the fourth transistor is coupled in parallel to the third transistor, with a common node to the third transistor, the fourth transistor, and the second transistor coupled to the specified plate line. The third plate select line and the fourth plate select line are situated in a second set of the plate select lines.

Variations of method 2000 or methods similar to method 2000 can include a number of different embodiments that may be combined depending on the application of such methods and/or the architecture of systems including a memory device in which such methods are implemented. Such methods can include generating signals to selected plate select lines of the memory device to place a non-specified plate line in a unselected state. Generating the signals can include generating a base line voltage state signal on a fifth plate select line coupled to a gate of a second transistor of a second plate line driver, where the second transistor of the second plate line driver is coupled to a first transistor of the second plate line driver and the fifth plate select line being in the first set of the plate select lines. A gate of the first transistor of the second plate line driver is coupled to the first plate select line. In addition, the base line voltage state signal is generated on a sixth plate select line coupled to a gate of a fourth transistor of the second plate line driver, with the sixth plate select line being in the second set of the plate select lines. The fourth transistor of the second plate line driver is coupled in parallel to a third transistor of the second plate line driver and a gate of the third transistor of the second plate line driver is coupled to the third plate select line. A common node to the third transistor of the second plate line driver, the fourth transistor of the second plate line driver, and the second transistor of the second plate line driver is coupled to the specified plate line.

Variations of method 2000 or methods similar to method 2000 can include alternative mechanisms of generating signals to selected plate select lines of the memory device to place a non-specified plate line in a unselected state. Generation of the signals can include generating a base line voltage state signal on a fifth plate select line coupled to a gate of a first transistor of a second plate line driver, where the fifth plate select line is in the first set of the plate select lines. The first transistor of the second plate line driver is coupled to a second transistor of the second plate line driver, where a gate of the second transistor of the second plate line driver is coupled to the first plate select line. In addition, the base line voltage state signal can be generated on a sixth plate select line coupled to a gate of a third transistor of the second plate line driver, where the sixth plate select line is in the second set of the plate select lines. The third transistor of the second plate line driver is coupled in parallel to a fourth transistor of the second plate line driver, with a gate of the fourth transistor of the second plate line driver coupled to the third plate select line. A common node to the third transistor of the second plate line driver, the fourth transistor of the second plate line driver, and the second transistor of the second plate line driver are coupled to the specified plate line. Variations can include generating base line voltage state signals to selected plate select lines of the memory device to place a non-specified plate line in a unselected state.

In various embodiments, a first memory device can comprise a subarray of memory cells, where each memory cell of the subarray includes a capacitor as a storage unit, with each capacitor having a plate coupled to a plate line. The first memory device can include a first set of multiple plate select lines, a second set of multiple plate select lines, and a plate line driver. The plate line driver can include a first transistor having a gate coupled to a first plate select line and a second transistor coupled to the first transistor, where the second transistor has a gate coupled to a second plate select line, with the first plate select line and the second plate select line being in the first set of multiple plate select lines. The plate line driver can include a third transistor having a gate coupled to a third plate select line and a fourth transistor having a gate coupled to a fourth plate select line, where the fourth transistor is coupled in parallel to the third transistor. A common node to the third transistor, the fourth transistor, and the second transistor is coupled to the plate line. The third plate select line and the fourth plate select line are in the second set of multiple plate select lines. The memory device includes a bias transistor coupled to the third transistor and the fourth transistor.

Variations of such a first memory device and its features, as taught herein, can include a number of different embodiments and features that can be combined depending on the application of such memory devices, the format of such memory devices, and/or the architecture in which such memory devices are implemented. Variations of such first memory devices can include the bias transistor of the plate line driver being coupled to a reference voltage node. Variations of such first memory devices can include the first transistor of the plate line driver being coupled to a VPL-node. In various embodiments, the plate line driver can have more than four transistors, where the additional transistors beyond the four transistors can be arranged in series between the first transistor and the VPLnode. Each of the additional transistors can be coupled to the multiple plate select lines according to a sequence to decode the identification of a specific plate line to be selected, with plate lines, other than the specific plate line, to be unselected.

Variations of such a first memory device and its features can include the first set of multiple plate select lines arranged as two subsets, with the first plate select line being in a first subset of the two subsets of the first set and the second plate select line being in a second subset of the two subsets of the first set. The second set of multiple plate select lines can be arranged as two subsets, with the third plate select line being in a first subset of the two subsets of the second set and the fourth plate select line being in a second subset of the two subsets of the second set.

Variations of such a first memory device and its features can include a controller to generate a high voltage state signal on the first plate select line and on the second plate select line and generate a low voltage state signal on the third plate select line and the fourth plate select line such that the plate line is operationally placed in a selected status. Variations of such a first memory device and its features can include a controller to generate a base line voltage state signal on the first plate select line, the second plate select line, third plate select line and the fourth plate select line such that the plate line is operationally in an unselected status.

In various embodiments, a second memory device can comprise a memory array, plate select lines, plate line drivers, and a controller. The second memory array can be partitioned into subarrays of memory cells, where each memory cell includes a capacitor as a storage unit. Each capacitor has a plate coupled to a plate line. The plate select lines can be arranged in groups of plate select lines and the plate line drivers can be coupled to the subarrays, where each plate line driver is assigned to a different subarray from other subarrays of the memory array. A given plate line driver can include a first transistor having a gate coupled to a first plate select line assigned to the given plate line driver and a second transistor coupled to the first transistor, where the second transistor has a gate coupled to a second plate select line assigned to the given plate line driver. The first plate select line and the second plate select line can be in a first group of the groups of plate select lines. The given plate line driver can include a third transistor having a gate coupled to a third plate select line assigned to the given plate line driver and a fourth transistor having a gate coupled to a fourth plate select line assigned to the given plate line driver. The third plate select line and the fourth plate select line can be in a second group of the groups of plate select lines. The fourth transistor is coupled in parallel to the third transistor, with a common node to the third transistor, the fourth transistor, and the second transistor coupled to a plate line to the subarray to which the given plate line driver is assigned. The given plate line driver can include a bias transistor coupled to the third transistor and the fourth transistor. The second memory device can include a controller to generate signals to the plate select lines to place a selected plate line in a selected status and place unselected plate lines in an unselected status.

Variations of such a second memory device and its features, as taught herein, can include a number of different embodiments and features that can be combined depending on the application of such first memory devices, the format of such first memory devices, and/or the architecture in which such first memory devices are implemented. Variations of such second memory devices can include the bias transistor of each plate line driver being coupled to a common node to receive a bias voltage. Variations can include the plate select lines being structured in number and the plate line drivers structured with a number of transistors to provide multilevel decoding to place the selected plate line in the selected status, the multilevel being at least a three level decoding.

Variations of such a second memory device and its features can include the controller being arranged to generate a high voltage state signal on the first plate select line and on the second plate select line assigned to the given plate line driver and generate a low voltage state signal on the third plate select line and the fourth plate select line assigned to the given plate line driver such that the plate line to the subarray to which the given plate line driver is assigned is operationally placed in a selected status. Variations of such a second memory device and its features, as taught herein, can include the controller being arranged to generate a base line voltage state signal on the first plate select line, the second plate select line, third plate select line and the fourth plate select line assigned to the given plate line driver such that the plate line to the subarray to which the given plate line driver is assigned is operationally placed in an unselected status.

Variations of such a second memory device and its features can include the plate line drivers being arranged in sets of equal number of plate line drivers. The second memory device can include the first group of plate select lines being arranged as a first subgroup of plate select lines and a second subgroup of plate select lines. The plate line drivers of each set can be coupled to plate select lines of the second subgroup of plate select lines in a same manner as the plate line drivers of other sets of the sets of equal number of plate line drivers. Each plate line driver of a first set of the sets of plate line drivers can be coupled to the same plate select line of the first subgroup of plate select lines and each plate line driver of a second set of the sets of plate line drivers can be coupled to plate select lines of the first subgroup of plate select lines different from the plate select lines of the first subgroup coupled to the first set of plate line drivers.

Variations of such a second memory device and its features can include each of the first group of plate select lines and the second group of plate select lines being arranged having a first subgroup of four plate select lines and a second subgroup of four plate select lines. Variations of such a second memory device and its features can include a multiplexer coupled to data lines from the subarrays and sense amplifiers coupled to the multiplexer. Various embodiments can include sixty-four data lines being coupled to the multiplexer from each of sixteen subarrays and the multiplexer having sixteen output lines with each output line of the sixteen output lines coupled to a different sense amplifier.

Figure 21:
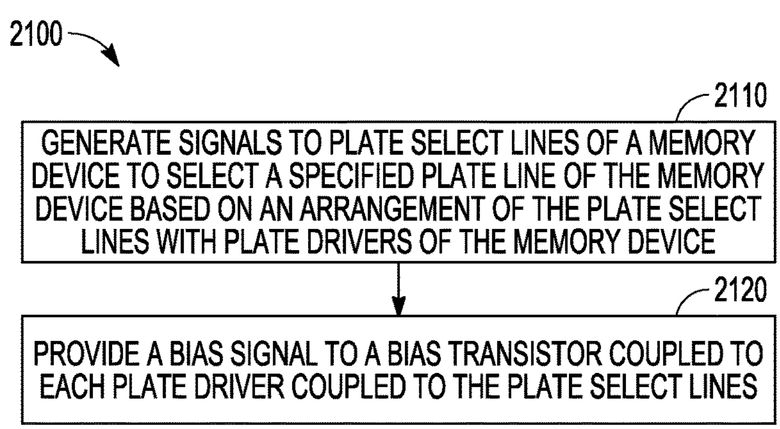
FIG. 21 is a flow diagram of features of an example method of selecting a specified plate line coupled to a plate of a capacitor arranged as a storage unit of a memory cell of a memory device, according to various embodiments.

FIG. 21 is a flow diagram of an embodiment of an example method 2100 of selecting a specified plate line coupled to a plate of a capacitor arranged as a storage unit of a memory cell of a memory device. The memory device has a memory array arranged as subarrays of memory cells, where each memory cell of a subarray includes a capacitor as a storage unit, with each capacitor having a plate coupled to a plate line assigned to the subarray. At 2110, signals are generated to plate select lines of the memory device to select a specified plate line of the memory device based on an arrangement of the plate select lines with plate line drivers of the memory device.

At 2120, a bias signal is provided to a bias transistor coupled to each plate line driver coupled to the plate select lines. Each plate line driver can include at least two transistors arranged in a series arrangement. With each plate line driver structured in the same manner, each plate line driver can include transistors or other components in addition to the at least two transistors arranged in a series arrangement. Each plate line driver can include at least two additional transistors arranged in a parallel arrangement, where the parallel arrangement is coupled to the at least two transistors. The parallel arrangement can be coupled to the at least two transistors in a second series arrangement with the at least two transistors. Other configurations can include, but are not limited to, three transistors in a series arrangement with three transistors coupled in a parallel together. The plate line drivers, in a given configuration of components, can be coupled to the bias transistor in a number of different arrangements.

Variations of method 2100 or methods similar to method 2100 can include a number of different embodiments that may be combined depending on the application of such methods and/or the architecture of systems including a memory device in which such methods are implemented. Such methods can include in an arrangement of plate line drivers and a bias transistor, each plate line driver including a diode coupled to the bias transistor at a node coupled to the diodes of other plate line drivers.

In another arrangement of plate line drivers and a bias transistor, variations can include providing a voltage to a p-type transistor of each plate line driver, the p-type transistors coupled to the bias transistor, with gates of the p-type transistors coupled to each other. The p-type transistor of each plate line driver can be structured with a common structure. The voltage can be at a value of a system supply voltage minus the threshold voltage of the p-type transistors. Other transistors of each plate line driver can be n-type transistors.

In another arrangement of plate line drivers and a bias transistor, variations can include controlling signals to two enable transistors of a switch. A first enable transistor of the two enable transistors can be coupled the bias transistor, with the bias transistor coupled to reference voltage node. A second enable transistor of the two enable transistors can be coupled to a VPLnode. The signal to the first enable transistor can be a signal that is complementary to the second enable transistor such that the plate line drivers are coupled by the switch to a system supply voltage or a voltage for placing on a plate line at a node common to the plate line drivers opposite and end of the plate line drivers coupled to the system supply voltage In various embodiments, a third memory device can comprise plate select lines, plate line drivers, and a bias transistor separate from the plate line drivers. The plate select lines can be coupled to capacitors of memory cells of the memory device. The plate line drivers can be coupled to the plate select lines, where each plate line driver includes at least two transistors arranged in a series arrangement. The bias transistor can be coupled to each plate line driver. With the bias transistor coupled to each plate line driver, a single bias transistor can be used for all the plate line drivers such that the individual plate line drivers can be structured without a bias transistor in the plate line driver. The use of a single bias transistor provides for reduction of construction of devices in forming the set of plate line drivers for the third memory device, which can reduce or eliminate mismatch between bias transistors in implementation of arrangements having a bias transistor in each plate line driver. Alternatively, a number of bias transistors can be used, with the number of bias transistors being less than the number of plate line drivers in the third memory device.

Variations of such a third memory device and its features, as taught herein, can include a number of different embodiments and features that can be combined depending on the application of such memory devices, the format of such memory devices, and/or the architecture in which such memory devices are implemented. Variations of such third memory devices can include each plate line driver having at least two additional transistors arranged in a parallel arrangement, where the parallel arrangement is coupled to the at least two transistors. The parallel arrangement is coupled to the at least two transistors in a second series arrangement with the at least two transistors. Each plate line driver can have an output node coupled to the parallel arrangement at a node common to a transistor of the at least two transistors, with the output node of each plate line driver coupled to a plate line assigned to the respective plate line driver.

Variations of such a third memory device and its features can include each plate line driver having a diode coupled to the bias transistor. Variations can include each plate line driver having a p-type transistor coupled to the bias transistor, where the p-type transistors of the plate line drivers structured in a cascode configuration. Variations can include the bias transistor being coupled to the plate line drivers by a switch.

In various embodiments, a fourth memory device can comprise a memory array partitioned into subarrays of memory cells, plate select lines, plate line drivers, a bias transistor separate from the plate line drivers, and a controller. Each memory cell includes a capacitor as a storage unit, where each capacitor has a plate coupled to a plate line. The plate select lines can be arranged in groups of plate select lines. The plate line drivers can be coupled to the subarrays, where each plate line driver is assigned to a subarray. A given plate line driver can have a number of transistors. A first transistor can have a gate coupled to a first plate select line assigned to the given plate line driver and a second transistor, coupled to the first transistor, can have a gate coupled to a second plate select line assigned to the given plate line driver. The first plate select line and the second plate select line can be in a first group of the groups of plate select lines. The given plate line driver can also include a third transistor and a fourth transistor. The third transistor can have a gate coupled to a third plate select line assigned to the given plate line driver. The fourth transistor can have a gate coupled to a fourth plate select line assigned to the given plate line driver, where the third plate select line and the fourth plate select line can be in a second group of the groups of plate select lines. The fourth transistor can be coupled in parallel to the third transistor. A common node to the third transistor, the fourth transistor, and the second transistor can be coupled to a plate line to the subarray to which the given plate line driver is assigned. The fourth memory device can include the bias transistor coupled to each plate line driver. The controller can be structured to generate signals to the plate select lines to place a selected plate line in a selected status and place unselected plate lines in an unselected status. With the bias transistor being a single bias transistor to all of the plate line drivers, the bias transistor can be made large compared to the other transistors of the plate line drivers, using less portions of the memory device IC, and can reduce the probability of mismatch that can occur with each plate line driver having its own bias transistor. Alternatively, a number of bias transistors can be used with the number of bias transistors being less than the number of plate line drivers in the fourth memory device.

Variations of such a fourth memory device and its features, as taught herein, can include a number of different embodiments and features that can be combined depending on the application of such memory devices, the format of such memory devices, and/or the architecture in which such memory devices are implemented. Variations of such fourth memory devices can include an arrangement of plate line drivers and a bias transistor with each plate line driver having a diode coupled to the bias transistor. Variations of such fourth memory devices can include an arrangement of plate line drivers and a bias transistor with the bias transistor coupled to a reference node, where the reference node is arranged to receive a voltage having a value of a system supply voltage minus a threshold voltage of the diode. Variations of such fourth memory devices can include an arrangement of plate line drivers and a bias transistor where each plate line driver includes a p-type transistor coupled to the bias transistor, where the p-type transistors of the plate line drivers can be structured in a cascode configuration. Variations of such fourth memory devices can include an arrangement of plate line drivers and a bias transistor with the bias transistor being coupled to a reference node, where the reference node is structured to receive a negative voltage.

Variations of such fourth memory devices can include an arrangement of plate line drivers and a bias transistor with the bias transistor being coupled to the plate line drivers by a switch. In an embodiment, the switch can include two enable transistors. A first enable transistor of the two enable transistors can be coupled the bias transistor with the bias transistor coupled to a reference voltage node. A second enable transistor of the two enable transistors can be coupled to a VPLnode. The first enable transistor and the second enable transistor can be coupled to a common node to which the plate line drivers are coupled.

Variations of such fourth memory devices can include a multiplexer coupled to data lines from the subarrays. The fourth memory devices can include sense amplifiers coupled to the multiplexer. The sense amplifiers can be arranged as a set of sense amplifiers.

Figure 22:
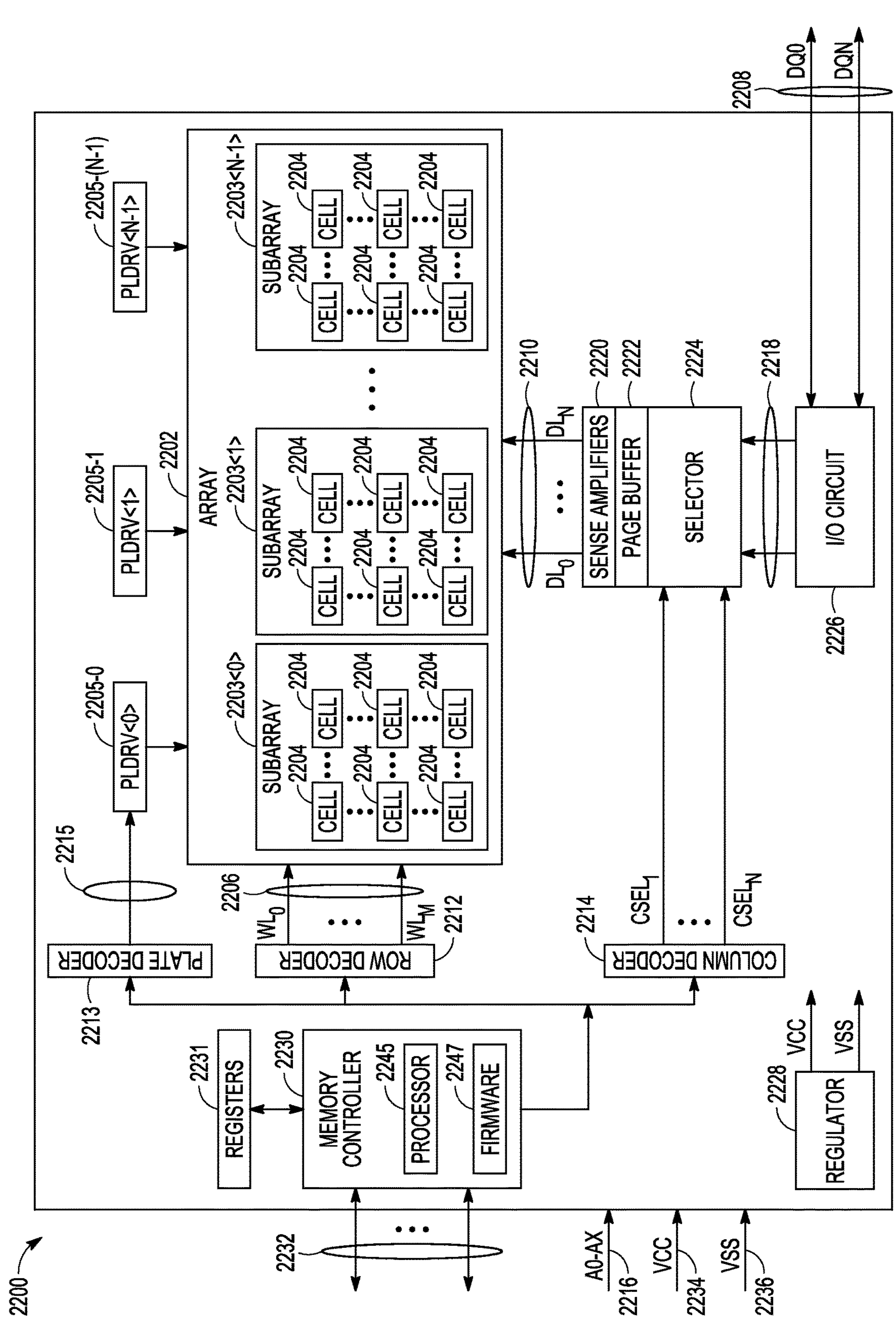
FIG. 22 illustrates a functional block diagram of an example memory device including a memory array having a plurality of memory cells, and one or more circuits or components to provide communication with or perform one or more memory operations on the memory array, according to various embodiments.

FIG. 22 illustrates a functional block diagram of an embodiment of an example memory device 2200 including a memory array 2202 having a plurality of memory cells 2204, and one or more circuits or components to provide communication with, or perform one or more memory operations on, the memory array 2202. Memory device 2200 can be a memory die, for example, a FeRAM die. Memory device 2200 can include a row decoder 2212, a column decoder 2214, plate decoder 2213, PLDRVs 2205-0, 2205-1 . . . 2205-(N-1), sense amplifiers 2220, a page buffer 2222, a selector 2224, an I/O circuit 2226, and a memory controller 2230. The memory controller 2230 can include processing circuitry, including one or more processors 2245, and can be configured to perform operations of the memory device 2200 by executing instructions, which can be stored in firmware 2247. For purposes of the present example, the instructions may be performed by memory within or dedicated to memory controller 2230. In other examples, at least some portion of the instructions executed by memory controller 2230 may be stored in other memory structures and loaded, for example into local (memory controller) memory for execution by the memory controller 2230.

Memory cells 2204 of the memory array 2202 can be structured similar to memory cells 1904 of FIG. 19 with each memory cell 2204 having an access transistor coupled to an access line, to a data line, and to a capacitor to store data. Memory cells 2204 can be arranged in subarrays, such as subarrays 2203<0>, 2203<1> . . . 2203<N-1>. Memory cells 2204 of subarrays 2203<0>, 2203<1> . . . 2203<N-1> can be coupled to plate lines from PLDRV<0>, PLDRV<1> PLDRV<N-1>, similar to the arrangement of memory device 1900 of FIG. 19. Plate decoder 2213 can be configured to place signals on plate select lines 2215 to PLDRV<0>, PLDRV<1> PLDRV<N-1> to select a plate of a subarray of subarrays 2203<0>, 2203<1> . . . 2203<N-1> with the plates of the other subarrays of subarrays 2203<0>, 2203<1> . . . 2203<N-1> being unselected. The plate select lines 2215 and PLDRV<0>, PLDRV<1> . . . PLDRV<N-1> can be structured similar to arrangement 200 of FIGS. 2A-2B, arrangement 800 of FIGS. 8A-8B, arrangement 1300 of FIGS. 13A-13B, arrangement 1400 of FIGS. 14A-14B, or combinations thereof.

The memory controller 2230 can control memory operations of the memory device 2200 according to one or more signals or instructions received on control lines 2232, including, for example, one or more clock signals or control signals that indicate a desired operation (e.g., write, read, erase, etc.), or address signals (A0-AX) received on one or more address lines 2216. One or more devices external to the memory device 2200 can control the values of the control signals on the control lines 2232 or the address signals on the address line 2216. Examples of devices external to the memory device 2200 can include, but are not limited to, a host, an external memory controller, a processor, or one or more circuits or components not illustrated in FIG. 22.

Memory device 2200 can use access lines 2206 and first data lines 2210 to transfer data to (e.g., write or erase) or from (e.g., read) one or more of the memory cells 2204. The row decoder 2212 and the column decoder 2214 can receive and decode the address signals (A0-AX) from the address line 2216, can determine which of the memory cells 2204 are to be accessed, and can provide signals to one or more of the access lines 2206 (e.g., one or more of a plurality of access lines ($WL_0$-$WL_M$)) or the first data lines 2210 (e.g., one or more of a plurality of data lines (BL0-BLN)), such as described above.

The memory device 2200 can include sense circuitry, such as the sense amplifiers 2220, configured to determine the values of data on (e.g., read), or to determine the values of data to be written to, the memory cells 2204 using the first data lines 2210. For example, in a selected memory cell 2204, one or more of the sense amplifiers 2220 can read a logic level in the selected memory cell 2204 in response to a read current flowing in memory array 2202 through the data line, of the data lines 2210, coupled to the selected memory cell 2204.

One or more devices external to the memory device 2200 can communicate with the memory device 2200 using the I/O lines (DQ0-DQN) 2208, address lines 2216 (A0-AX), or control lines 2232. The I/O circuit 2226 can transfer values of data in or out of the memory device 2200, such as in or out of the page buffer 2222 or the memory array 2202, using the I/O lines 2208, according to, for example, the control lines 2232 and address lines 2216. The page buffer 2222 can store data received from the one or more devices external to the memory device 2200 before the data is programmed into relevant portions of the memory array 2202, or can store data read from the memory array 2202 before the data is transmitted to the one or more devices external to the memory device 2200.

The column decoder 2214 can receive and decode address signals (A0-AX) into one or more column select signals ($CSEL_1$-$CSEL_N$). The selector 2224 (e.g., a select circuit) can receive the column select signals ($CSEL_1$-$CSEL_N$) and select data in the page buffer 2222 representing values of data to be read from or to be programmed into memory cells 2204. Selected data can be transferred between the page buffer 2222 and the I/O circuit 2226 using second data lines 2218.

The memory controller 2230 can receive positive and negative supply signals, such as a supply voltage (Vcc) 2234 and a negative supply (VSS) 2236, which can also be a ground potential, with respect to Vcc, from an external source or supply (e.g., an internal or external battery, an AC-to-DC converter, etc.). In certain examples, the memory controller 2230 can include a regulator 2228 to internally provide positive or negative supply signals.

The following example embodiments of methods and devices, in accordance with the teachings herein.

An example memory device 1 can comprise: plate select lines coupled to capacitors of memory cells of the memory device; plate line drivers coupled to the plate select lines, each plate line driver including at least two transistors arranged in a series arrangement; and a bias transistor coupled to each plate line driver.

An example memory device 2 can include features of example memory device 1 and can include each plate line driver including at least two additional transistors arranged in a parallel arrangement, the parallel arrangement coupled to the at least two transistors.

An example memory device 3 can include features of example memory device 2 and can include the parallel arrangement being coupled to the at least two transistors in a second series arrangement with the at least two transistors.

An example memory device 4 can include features of example memory device 2 and any of the preceding example memory devices and can include each plate line driver having an output node coupled to the parallel arrangement at a node common to a transistor of the at least two transistors, with the output node of each plate line driver coupled to a plate line assigned to the respective plate line driver.

An example memory device 5 can include features of any of the preceding example memory devices and can include each plate line driver including a diode coupled to the bias transistor.

An example memory device 6 can include features of any of the preceding example memory devices and can include each plate line driver including a p-type transistor coupled to the bias transistor, the p-type transistors of the plate line drivers structured in a cascode configuration.

An example memory device 7 can include features of any of the preceding example memory devices and can include the bias transistor being coupled to the plate line drivers by a switch.

In an example memory device 8, any of the memory devices of example memory devices 1 to 7 may include memory devices incorporated into an electronic apparatus further comprising a host processor and a communication bus extending between the host processor and the memory device.

In an example memory device 9, any of the memory devices of example memory devices 1 to 8 may be modified to include any structure presented in another of example memory device 1 to 8.

In an example memory device 10, any apparatus associated with the memory devices of example memory devices 1 to 9 may further include a machine-readable storage device configured to store instructions as a physical state, wherein the instructions may be used to perform one or more operations of the apparatus.

In an example memory device 11, any of the memory devices of example memory devices 1 to 10 may be operated in accordance with any of the below example methods 1 to 8.

An example memory device 12 can comprise a memory array, plate select lines, plate line divers, a bias transistor, and a controller. The memory array can be partitioned into subarrays of memory cells, each memory cell including a capacitor as a storage unit, where each capacitor has a plate coupled to a plate line. The plate select lines can be arranged in groups of plate select lines, the plate line drivers can be coupled to the subarrays, where each plate line driver is assigned to a subarray. A given plate line driver pf the plate line drivers can include: a first transistor having a gate coupled to a first plate select line assigned to the given plate line driver; a second transistor coupled to the first transistor, the second transistor having a gate coupled to a second plate select line assigned to the given plate line driver, the first plate select line and the second plate select line being in a first group of the groups of plate select lines; a third transistor having a gate coupled to a third plate select line assigned to the given plate line driver; and a fourth transistor having a gate coupled to a fourth plate select line assigned to the given plate line driver, the third plate select line and the fourth plate select line being in a second group of the groups of plate select lines, the fourth transistor coupled in parallel to the third transistor, with a common node to the third transistor, the fourth transistor, and the second transistor coupled to a plate line to the subarray to which the given plate line driver is assigned. The bias transistor can be coupled to each plate line driver. The controller can be structured to generate signals to the plate select lines to place a selected plate line in a selected status and place unselected plate lines in an unselected status.

An example memory device 13 can include features of example memory device 11 and can include each plate line driver including a diode coupled to the bias transistor.

An example memory device 14 can include features of example memory device 13 and any features of the preceding example memory devices 12 to 13 and can include the bias transistor being coupled to a reference node, the reference node to receive a voltage having a value of a system supply voltage minus a threshold voltage of the diode.

An example memory device 15 can include features of any of the preceding example memory devices 12 to 14 and can include each plate line driver including a p-type transistor coupled to the bias transistor, the p-type transistors of the plate line drivers structured in a cascode configuration.

An example memory device 16 can include features of example memory device 15 and any of the preceding example memory devices 12 to 15 and can include the bias transistor being coupled to a reference node, the reference node to receive a negative voltage.

An example memory device 17 can include features of any of the preceding example memory devices 12 to 16 and can include the bias transistor being coupled to the plate line drivers by a switch.

An example memory device 18 can include features of example memory device 17 and features any of the preceding example memory devices 12 to 17 and can include the switch including two enable transistors, a first enable transistor of the two enable transistors coupled to the bias transistor with the bias transistor coupled to reference voltage node and a second enable transistor of the two enable transistors coupled to a plate line voltage node.

An example memory device 19 can include features of example memory device 18 and features of any of the preceding example memory devices 12 to 18 and can include the first enable transistor and the second enable transistor being coupled to a common node to which the plate line drivers are coupled.

An example memory device 20 can include features of any of the preceding example memory devices 12 to 19 and can include the memory device including a multiplexer coupled to data lines from the subarrays and sense amplifiers coupled to the multiplexer.

In an example memory device 21, any of the memory devices of example memory devices 12 to 20 may include the memory devices incorporated into an electronic apparatus further comprising a host processor and a communication bus extending between the host processor and the memory device.

In an example memory device 22, any of the memory devices of example memory devices 12 to 21 may be modified to include any structure presented in another of example memory device 12 to 21.

In an example memory device 23, any apparatus associated with the memory devices of example memory devices 12 to 22 may further include a machine-readable storage device configured to store instructions as a physical state, wherein the instructions may be used to perform one or more operations of the apparatus.

In an example memory device 24, any of the memory devices of example memory devices 12 to 23 may be operated in accordance with any of the below example methods 1 to 8.

An example method 1 can comprise generating signals to plate select lines of a memory device to select a specified plate line of the memory device based on an arrangement of the plate select lines with plate line drivers of the memory device, the memory device having a memory array arranged as subarrays of memory cells, each memory cell of a subarray including a capacitor as a storage unit, each capacitor having a plate coupled to a plate line assigned to the subarray; and providing a bias signal to a bias transistor coupled to each plate line driver coupled to the plate select lines.

An example method 2 can include features of example method 1 and can include each plate line driver including a diode coupled to the bias transistor at a node coupled to the diodes of other plate line drivers.

An example method 3 can include features of any of the preceding example methods and can include providing a voltage to a p-type transistor of each plate line driver, the p-type transistors coupled to the bias transistor, with gates of the p-type transistors coupled to each other.

An example method 4 can include features of example method 3 and any of the preceding example methods and can include controlling signals to two enable transistors of a switch, a first enable transistor of the two enable transistors coupled the bias transistor with the bias transistor coupled to a reference voltage node and a second enable transistor of the two enable transistors coupled to a plate line voltage node.

In an example method 5, any of the example methods 1 to 4 may be performed in operating an electronic apparatus further comprising a host processor and a communication bus extending between the host processor and the memory device.

In an example method 6, any of the example methods 1 to 5 may be modified to include operations set forth in any other of example methods 1 to 5.

In an example method 7, any of the example methods 1 to 6 may be implemented at least in part through use of instructions stored as a physical state in one or more machine-readable storage devices.

An example method 8 can include features of any of the preceding example methods 1 to 7 and can include performing functions associated with any features of example memory devices 1 to 11 and example memory devices 12 to 24.

An example machine-readable storage device storing instructions, that when executed by one or more processors, cause a machine to perform operations, can comprise instructions to perform functions associated with any features of example memory devices 1 to 11 or example memory devices 12 to 24 or perform methods associated with any features of example methods 1 to 8.

Although specific embodiments have been illustrated and described herein, it will be appreciated by those of ordinary skill in the art that any arrangement that is calculated to achieve the same purpose can be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A memory device comprising:

plate select lines coupled to capacitors of memory cells of the memory device;

plate line drivers coupled to the plate select lines, each plate line driver including at least two transistors arranged in a series arrangement in the plate line driver; and a bias transistor coupled to each plate line driver of the plate line drivers such that the bias transistor is shared by the plate line drivers.

2. The memory device of claim 1, wherein each plate line driver includes at least two additional transistors arranged in a parallel arrangement, the parallel arrangement coupled to the at least two transistors.

3. The memory device of claim 2, wherein the parallel arrangement is coupled to the at least two transistors in a second series arrangement with the at least two transistors.

4. The memory device of claim 3, wherein each plate line driver has an output node coupled to the parallel arrangement at a node common to a transistor of the at least two transistors, with the output node of each plate line driver coupled to a plate line assigned to the respective plate line driver.

5. The memory device of claim 1, wherein each plate line driver includes a diode coupled to the bias transistor.

6. The memory device of claim 1, wherein each plate line driver includes a p-type transistor coupled to the bias transistor, the p-type transistors of the plate line drivers structured in a cascode configuration.

7. The memory device of claim 1, wherein the bias transistor is coupled to the plate line drivers by a switch.

8. A memory device comprising:

a memory array partitioned into subarrays of memory cells, each memory cell including a capacitor as a storage unit, each capacitor having a plate coupled to a plate line;

plate select lines arranged in groups of plate select lines;

plate line drivers coupled to the subarrays, each plate line driver assigned to a subarray, a given plate line driver including:

a first transistor having a gate coupled to a first plate select line assigned to the given plate line driver;

a second transistor coupled to the first transistor, the second transistor having a gate coupled to a second plate select line assigned to the given plate line driver, the first plate select line and the second plate select line being in a first group of the groups of plate select lines;

a third transistor having a gate coupled to a third plate select line assigned to the given plate line driver; and a fourth transistor having a gate coupled to a fourth plate select line assigned to the given plate line driver, the third plate select line and the fourth plate select line being in a second group of the groups of plate select lines, the fourth transistor coupled in parallel to the third transistor, with a common node to the third transistor, the fourth transistor, and the second transistor coupled to a plate line to the subarray to which the given plate line driver is assigned;

a bias transistor coupled to each plate line driver; and a controller to generate signals to the plate select lines to place a selected plate line in a selected status and place unselected plate lines in an unselected status.

9. The memory device of claim 8, wherein each plate line driver includes a diode coupled to the bias transistor.

10. The memory device of claim 9, wherein the bias transistor is coupled to a reference node, the reference node to receive a voltage having a value of a system supply voltage minus a threshold voltage of the diode.

11. The memory device of claim 8, wherein each plate line driver includes a p-type transistor coupled to the bias transistor, the p-type transistors of the plate line drivers structured in a cascode configuration.

12. The memory device of claim 11, wherein the bias transistor is coupled to a reference node, the reference node to receive a negative voltage.

13. The memory device of claim 8, wherein the bias transistor is coupled to the plate line drivers by a switch.

14. The memory device of claim 13, wherein the switch includes two enable transistors, a first enable transistor of the two enable transistors coupled to the bias transistor with the bias transistor coupled to a reference voltage node and a second enable transistor of the two enable transistors coupled to a plate line voltage node.

15. The memory device of claim 14, wherein the first enable transistor and the second enable transistor are coupled to a common node to which the plate line drivers are coupled.

16. The memory device of claim 8, wherein the memory device includes:

a multiplexer coupled to data lines from the subarrays; and sense amplifiers coupled to the multiplexer.

17. A method comprising:

generating signals to plate select lines of a memory device to select a specified plate line of the memory device based on an arrangement of the plate select lines with plate line drivers of the memory device, the memory device having a memory array arranged as subarrays of memory cells, each memory cell of a subarray including a capacitor as a storage unit, each capacitor having a plate coupled to a plate line assigned to the subarray; and providing a bias signal to a bias transistor coupled to each plate line driver of the plate line drivers coupled to the plate select lines with the bias transistor being shared by the plate line drivers.

18. The method of claim 17, wherein each plate line driver includes a diode coupled to the bias transistor at a node coupled to the diodes of other plate line drivers.

19. The method of claim 17, wherein the method includes providing a voltage to a p-type transistor of each plate line driver, the p-type transistors coupled to the bias transistor, with gates of the p-type transistors coupled to each other.

20. The method of claim 17, wherein the method includes controlling signals to two enable transistors of a switch, a first enable transistor of the two enable transistors coupled to the bias transistor with the bias transistor coupled to reference voltage node and a second enable transistor of the two enable transistors coupled to a plate line voltage node.

* * * * *